United States Patent
Magnussen et al.

(10) Patent No.: US 7,224,099 B2
(45) Date of Patent: May 29, 2007

(54) MOLDED PIEZOELECTRIC APPARATUS

(75) Inventors: Bjoern Magnussen, Iserlohn (DE); Peter C. Varadi, Albany, CA (US)

(73) Assignee: Elliptec Resonant Actuator Aktiengesellschaft (DE)

( * ) Notice: Subject to any disclaimer, the term of this patent is extended or adjusted under 35 U.S.C. 154(b) by 302 days.

(21) Appl. No.: 10/827,980

(22) Filed: Apr. 20, 2004

(65) Prior Publication Data
US 2005/0231071 A1  Oct. 20, 2005

(51) Int. Cl.
*H01L 41/08* (2006.01)
(52) U.S. Cl. ............ 310/311; 310/325; 310/328; 29/25.35
(58) Field of Classification Search ........... 29/25.35
See application file for complete search history.

(56) References Cited

U.S. PATENT DOCUMENTS

| | | | |
|---|---|---|---|
| 2,930,912 A | | 3/1960 | Miller |
| 3,230,402 A | * | 1/1966 | Nightingale et al. ........ 310/338 |
| 3,466,473 A | * | 9/1969 | Rhoten ........................ 310/339 |
| 4,220,886 A | * | 9/1980 | Ciszewski et al. .......... 310/325 |
| 4,420,826 A | | 12/1983 | Marshall, Jr. et al. |
| 4,663,556 A | | 5/1987 | Kumada |
| 4,728,843 A | | 3/1988 | Mishiro |
| 4,857,791 A | | 8/1989 | Uchino et al. |
| 4,893,045 A | | 1/1990 | Honda |
| 5,109,698 A | | 5/1992 | Owen |
| 5,155,709 A | | 10/1992 | Flanagan et al. |
| 5,162,692 A | | 11/1992 | Fujumura |
| 5,218,259 A | * | 6/1993 | Dam et al. ................... 310/328 |
| 5,305,507 A | * | 4/1994 | Dvorsky et al. ............ 29/25.35 |
| 5,416,375 A | | 5/1995 | Funakubo et al. |
| 5,469,011 A | * | 11/1995 | Safabakhsh .................. 310/325 |
| 5,566,132 A | | 10/1996 | Janus et al. |
| 5,894,651 A | * | 4/1999 | Dvorsky et al. ............ 310/344 |
| 5,900,691 A | | 5/1999 | Reuter et al. |
| 5,907,211 A | | 5/1999 | Hall et al. |
| 5,917,269 A | | 6/1999 | Maruyama et al. |
| 6,147,436 A | | 11/2000 | Claeyssen et al. |
| 6,242,847 B1 | * | 6/2001 | Puskas ....................... 310/325 |
| 6,262,515 B1 | | 7/2001 | Yerganian |
| 6,664,714 B2 | | 12/2003 | Magnussen et al. |
| 6,870,304 B2 | * | 3/2005 | Magnussen et al. ... 310/323.02 |
| 2003/0052575 A1 | | 3/2003 | Mock et al. |

FOREIGN PATENT DOCUMENTS

DE  19928780  1/2001

(Continued)

*Primary Examiner*—Mark Budd
(74) *Attorney, Agent, or Firm*—Stetina Brunda Garred & Brucker

(57) ABSTRACT

A piezoelectric apparatus comprising a piezoelectric element that is held in static compression is manufactured using moldable materials and a molding process, e.g., injection molding or die casting. The static compression is caused by an intrinsic urge of the moldable material to expand, contract, or deform otherwise, which develops in the material during the hardening phase of the molding process. To enhance the usefulness of the device, a variety of inserts can be connected to the device and various features can be formed by the moldable material at the same time as the molding process takes place. Static preloads may also be caused by mechanically preloaded elements that are introduced during the molding process or by elements that concurrently introduced but that are permanently deformed thereafter.

24 Claims, 18 Drawing Sheets

FOREIGN PATENT DOCUMENTS

| | | |
|---|---|---|
| EP | 0231940 | 8/1987 |
| EP | 0569673 | 11/1993 |
| JP | 64001481 | 1/1989 |
| JP | 2260476 | 10/1990 |
| WO | WO9853509 | 11/1998 |
| WO | WO0045444 | 8/2000 |
| WO | WO0302819 | 4/2003 |

* cited by examiner

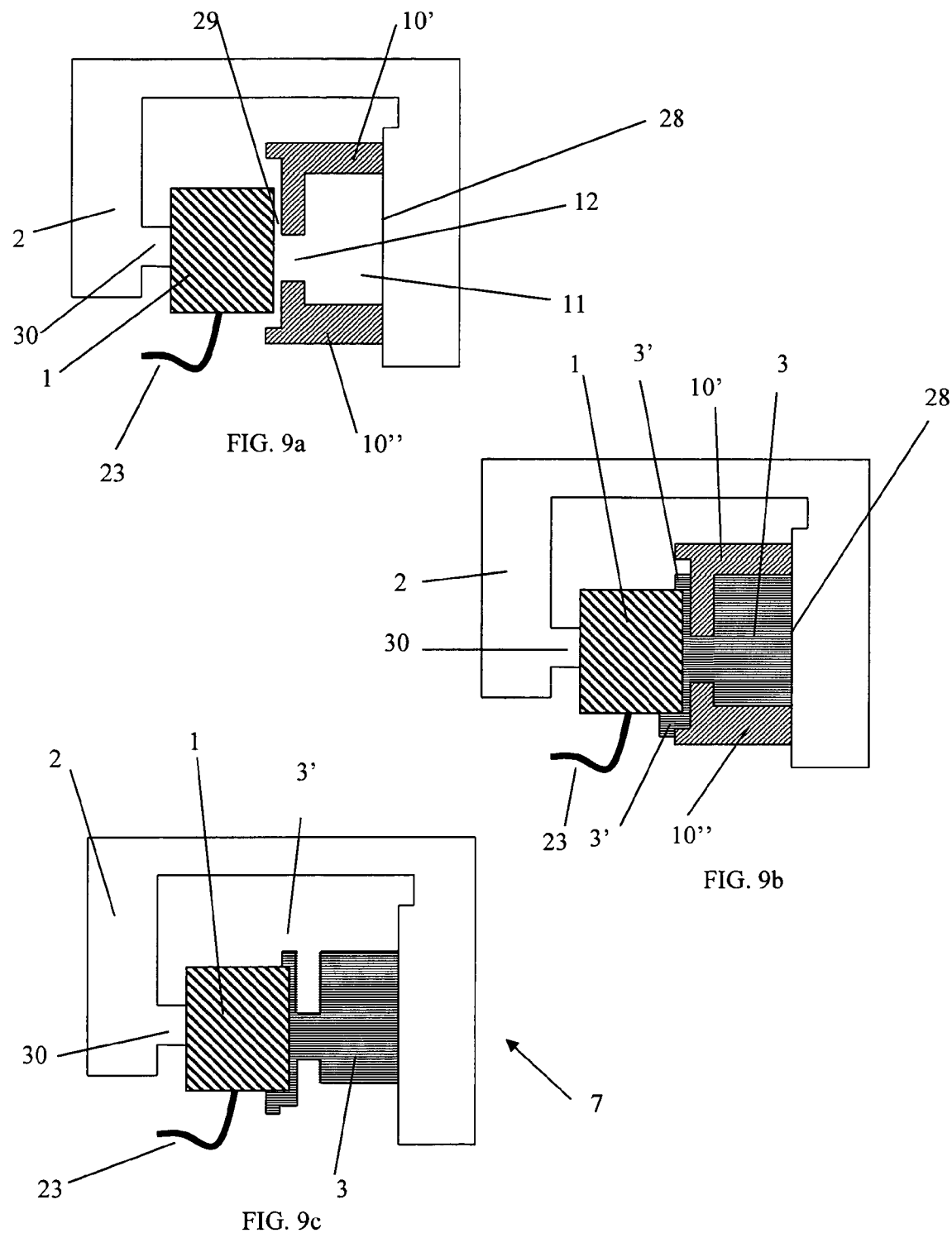

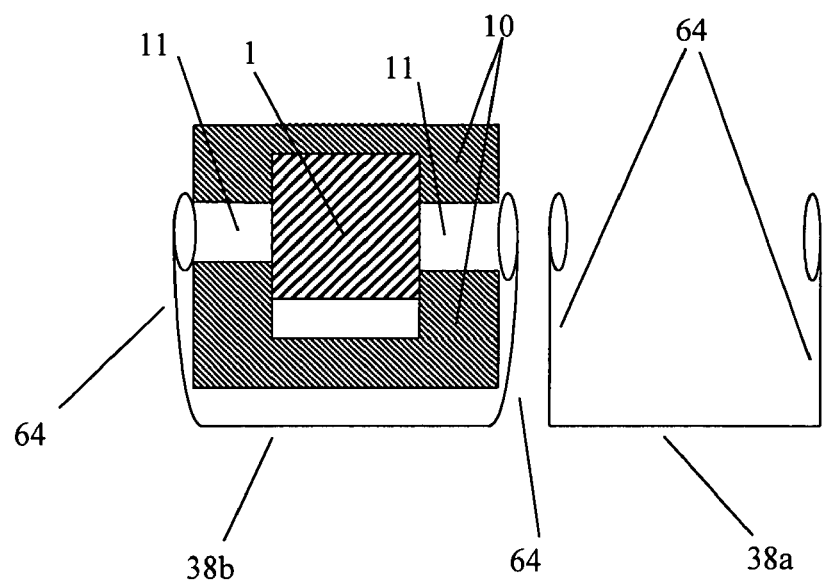
FIG. 15a
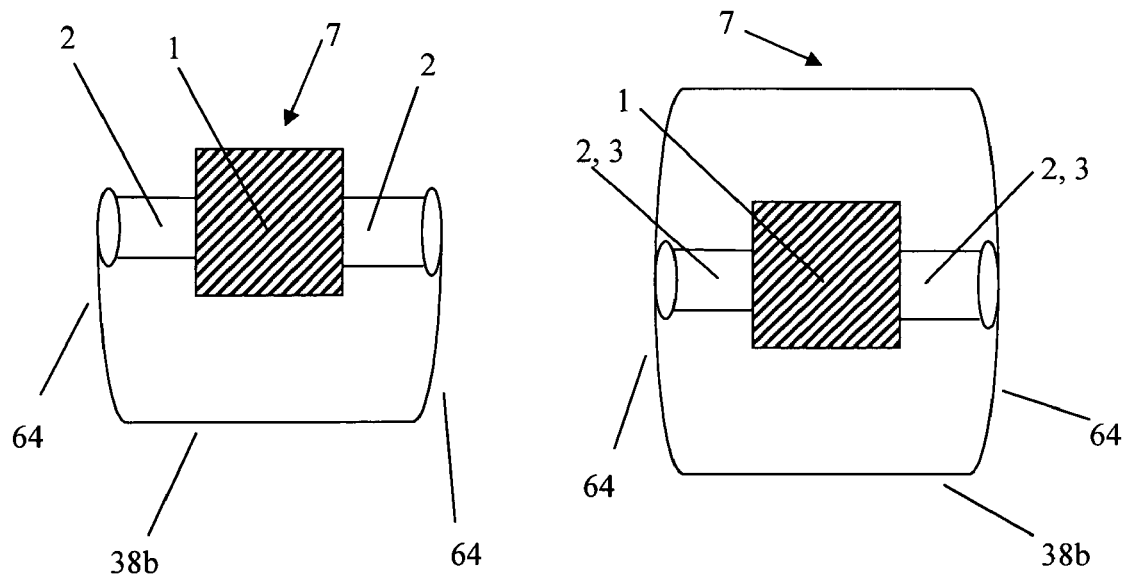
FIG. 15b
FIG. 15c

MOLDED PIEZOELECTRIC APPARATUS

FIELD OF INVENTION

This invention relates to a piezoelectric apparatus that is manufactured using injection molding and die-cast principles and preferably polymeric compounds to place a piezoelectric element in compression within the piezoelectric apparatus.

BACKGROUND OF THE INVENTION

In a typical piezoelectric apparatus, a piezoelectric element is mechanically connected to another part, such as a mechanical resonator, to transmit vibratory motion into that part when an appropriate electrical signal is applied to the piezoelectric element. Such a piezoelectric apparatus generally falls into one of two categories. In the first category, the piezoelectric element is placed in static compression along the principal axis of piezoelectric action by a mechanical preload in order to prevent potentially damaging tensile forces on the piezoelectric element during operation of the apparatus. In the second category, such a preload is not necessary. An apparatus comprising a multilayer, stack-type piezoelectric element typically falls into the first category, while an apparatus comprising a bending-type or shear-type piezoelectric element typically falls into the second category. This invention relates to an apparatus of the first category and methods for manufacturing the same.

A variety of methods are known in the prior art to place a piezoelectric element in static compression. A first, often-used method comprises placing the piezoelectric element between two rigid surfaces and urging the surfaces together using, for example, one or more bolts that extend through holes in those surfaces. The need for assembling the one or more bolts is a drawback of the method and apparatus as this assembly step and required hardware typically increases manufacturing costs.

In a second method, the part that is to be mechanically connected to the piezoelectric element comprises an opening. The part could, for example, serve as a mechanical resonator. The dimension of the piezoelectric element along the principal axis of piezoelectric action is selected somewhat larger than the corresponding dimension of the opening in the resonator. In order to accommodate the piezoelectric element, some of the resonator material surrounding the opening must extend and deform elastically, or even plastically. U.S. Pat. No. 6,664,714 teaches this method. As a result of the deformation, the piezoelectric element is held in compression within the opening by the resonator material surrounding the opening. The need for maintaining certain mechanical tolerances for all the parts involved is a drawback of this method. Also, the process of inserting the piezoelectric element into the opening can pose difficulties as it may lead to scraping or abrasion on both the piezoelectric element and the inside of the opening. Also, the forces necessary to insert the piezoelectric element may damage it. Furthermore, the resonator is separately manufactured prior to the step of inserting the piezoelectric element.

Metals are typically used to form the part holding a piezoelectric element in compression. In some instances, a non-metallic material such as a polymer is placed on the mechanical contact surface of the piezoelectric element in order to fill in surface asperities and to alleviate dimensional tolerances. Such an interposed polymer does not by itself actively place the piezoelectric element in compression, i.e., it does not have an intrinsic urge to do so. Instead, the polymer is itself compressed by the compressive action of the part that supports the piezoelectric element. The compressive action in turn is caused by external means such as, for example, tensioning bolts. Furthermore, the interposed polymer does not completely separate the piezoelectric element from the part holding the piezoelectric element in compression. It merely serves to enhance the mutual mechanical contact. German Patent DE19928780 discloses such an interposed polymer and its uses. Here as well, interposing the polymeric compound and imprinting a mechanical preload are two separate steps.

There is thus a need for a piezoelectric apparatus and manufacturing methods therefore, wherein a piezoelectric element is held in static compression and wherein the compressive force neither is caused by separate mounting hardware such as a preloading screw, nor is due to a separate assembly process such as the press-fit method disclosed in U.S. Pat. No. 6,664,714.

BRIEF SUMMARY OF THE INVENTION

The present invention provides a method for manufacturing at least a portion of the piezoelectric device and for the simultaneous generation of a compressive preload on the piezoelectric element so that the mechanical preload is caused by an intrinsic urge of the portion to change dimension by extending, contracting or otherwise deforming while being manufactured, and preferably so that the mechanical preload is only caused by that intrinsic urge to change dimension.

This invention presents such an apparatus based on the injection molding of polymers, the die casting of metals, or similar, related methods. For that reason, a portion that is adjacent to the piezoelectric element can be formed concurrently making the device insensitive to surface asperities in the mechanical contact region of the piezoelectric element.

Polymers have an advantage over metals in that some can be processed in a liquid or near-liquid form at lower temperatures, or in that some are processed as separate chemical compounds that react to form the polymer at the time of manufacture. Polymers are easily combined with other materials to form composites. Both pure polymers and their composites will be referred to as polymeric compounds for simplicity. While polymers can be processed using injection molding or similar, metals and their composites are typically processed using die-casting or similar. For the purpose of the present invention, however, these terms will be used interchangeably as the both refer to a method to shape a material using some form of mold although a complete mold may not be necessary if the processed compound is sufficiently viscous.

As a compound, which initially can be liquid, powdery, etc., hardens inside the mold, it can develop an intrinsic urge to contract, expand, or deform otherwise. Instead of being an undesired side effect, this effect is purposefully exploited in the present invention to place a piezoelectric element in compression inside a piezoelectric apparatus while concurrently forming at least a portion of the apparatus.

A further advantage of injection molding of polymers and die casting of metals is that they are efficient mass production processes that offer a broad range of shapes and surface finishes.

It is thus an object of one aspect of the present invention to provide a piezoelectric device that comprises a piezoelectric element being held in static compression by a carrier so that the compressive force to hold the piezoelectric element in compression is generated by a metallic, polymeric, or other compound that develops an intrinsic urge to expand, contract, or deform otherwise, e.g., due to shrinkage, during molding of the carrier or portions thereof from the compound. The piezoelectric element is advantageously compressed along its axis of electric polarization.

In a preferred embodiment only the compound is in direct mechanical contact with the piezoelectric element with the exception of electrical connections to the piezoelectric element. The compound may completely encase the piezoelectric element.

In one embodiment, the compound comprises a mechanically pre-stressed element and/or the static compression is caused by the electric polarization of the piezoelectric element. Furthermore, the compound may be electrically conductive.

In a preferred embodiment, the carrier has a selected contacting portion located to engage a driven element during use of the system—or the carrier is connected to a part having such a contacting portion—to serve as a piezoelectric vibratory motor, wherein the selected contacting portion and the piezoelectric element are continuously connected by the compound. The compound may also form a resilient element for mounting the vibratory system to a base and for resiliently urging the selected contacting portion against the driven element during use of the system.

In a preferred embodiment, the carrier comprises an insert that is continuously connected to the piezoelectric element by the compound and provides additional functionality.

There is further provided a method for producing a vibratory system comprising a piezoelectric element, a carrier to hold the piezoelectric element in compression and a metallic, polymeric thermoset, polymeric duropolast, ceramic, or other moldable compound with an intrinsic urge to cause the compressive force to hold the piezoelectric element in compression, wherein the method comprises molding the compound while simultaneously connecting it to the carrier and the piezoelectric element and while allowing the compound to develop an intrinsic urge, e.g., due to shrinkage, during the hardening phase of the molding to place the piezoelectric element in static compression. The compound may contact only a portion of the piezoelectric element or its entire surface. The compound my be a composite material comprising filler materials such as glass fibers, glass spheres, carbon fibers, carbon powder, minerals, or other.

In a preferred variation of the method, the entire carrier itself is molded from the compound while being connected to the piezoelectric element. In a further preferred variation of the method, the compound is molded under pressure and at least a portion of that pressure is maintained after molding to create an intrinsic expansive urge in the compound. The compound may simultaneously form a resilient element for mounting the vibration device during molding.

In another preferred variation of the method, the piezoelectric element is held in place during molding by electrical connections to the piezoelectric element through which an electrical signal may be applied during the manufacture of the system. The compound is preferably selected to maximize the transmission of mechanical vibrations from the piezoelectric element into the carrier when the piezoelectric element is excited with a vibratory electric signal. It is possible to cause the static preload on the piezoelectric element by electrically polarizing the piezoelectric element.

There is further provided a method for producing a vibratory system comprising a piezoelectric element and an insert, wherein the method comprises molding a moldable compound to connect the piezoelectric element and the insert in a manner that permanently places the piezoelectric element in static compression during manufacture of the device. The insert is preferably a statically preloaded element, e.g., a clamp type device, whose static preload causes the static compression of the piezoelectric element.

In a variation of the method, the insert is plastically deformed after completion of the mold to cause the static preload on the piezoelectric element.

BRIEF DESCRIPTION OF THE DRAWINGS

These as well as other features of the present invention will become more apparent upon reference to the drawings, in which like numbers refer to like parts throughout, and in which:

FIG. 8a shows a piezoelectric device that can be manufactured using the method of FIGS. 7a–7c and FIG. 8b shows a cross-section of the device taken along the plane perpendicular to axis A as shown in FIG. 8a;

FIGS. 9a–9c illustrate a further method of assembling a piezoelectric device using a mold, wherein only a portion of the part that supports the piezoelectric element is formed within the mold;

FIG. 15a shows a piezoelectric element in a mold and an external resilient member placed on the mold to mechanically preload the piezoelectric element;

FIG. 15b shows the piezoelectric device formed by FIG. 15a;

FIG. 15c shows a variation of the piezoelectric device of FIG. 15b;

DETAILED DESCRIPTION

Figure 1:
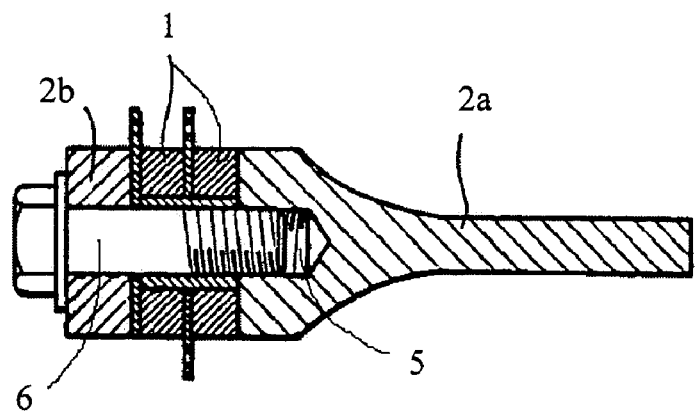
FIG. 1 is a is a prior art embodiment of a clamping arrangement to place a piezoelectric element in compression.

Referring to FIG. 1, this invention relates to piezoelectric devices 7 that comprise at least a piezoelectric element 1 and a carrier 2 to hold the piezoelectric element 1 in static compression to prevent damage to the piezoelectric element 1 due to tensile forces during operation of the device 7, which is a particularly important issue if the piezoelectric element 1 has a multilayer construction. In the description that follows and in the associated figures, like numbers refer to like parts and features throughout.

FIG. 1 exemplifies a typical prior art piezoelectric apparatus as disclosed in U.S. Pat. No. 4,728,843, wherein a piezoelectric element 1 is held in static compression by fastening a threaded bolt 6 that extends through a threaded hole 5 in a carrier 2. In the case shown, the carrier 2 is divided into portions 2a and 2b and the piezoelectric element 1 has a through hole for the bolt 6. The method of placing a piezoelectric element 1 in compression using a bolt type mechanism is convenient for quick assembly and disassembly of a piezoelectric device. However, this method does not adapt easily to mass production. Also, the fastening bolt 6 may exert a damaging torque onto the piezoelectric element 1.

Figure 2:
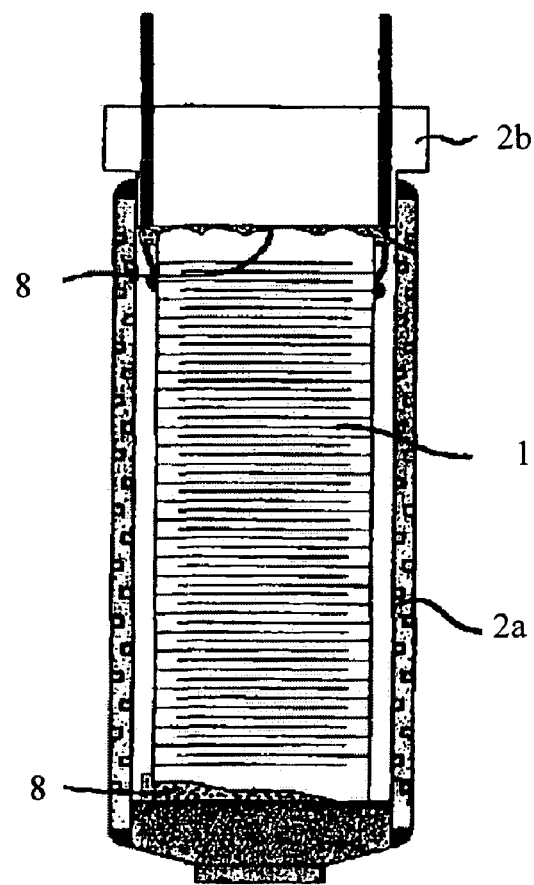
FIG. 2 illustrates another prior art clamping arrangement to place a piezoelectric element in compression wherein a material layer is interposed between the piezoelectric element and a carrier to even out surface asperities on the piezoelectric element.

FIG. 2 shows a prior art piezoelectric apparatus as disclosed in German Patent DE19928780. Here the piezoelectric element 1 is held between divided carriers 2a, 2b, which, during assembly, are joined together by external means to form a carrier 2 and to place the piezoelectric element 1 in compression. The apparatus in FIG. 2 also has a material 8 interposed between the piezoelectric element 1 and the carrier 2 to improve force transmission between the piezoelectric element 1 and the carrier 2, to reduce electromechanical property variations of the piezoelectric device, and to fill surface asperities on the piezoelectric element, which are typical on piezoelectric elements 1 unless the piezoelectric element 1 surface is ground even. The interposed material 8 does not completely separate the piezoelectric element 1 from the carrier 2 but bridges gaps where the two elements fail to touch due to the surface asperities. The interposed material 8 also does not itself actively place the piezoelectric element 1 in static compression, i.e., it has no intrinsic urge to do so. The material 8 is inserted between the piezoelectric element 1 and the carrier element 2a or 2b prior to the step of pressing the carrier elements 2a and 2b together by external means to form the carrier 2.

In contrast, the invention disclosed herein manufactures piezoelectric devices 7 that exert preload without separate fasteners such as a bolt 6 and that may not require separate interposed materials 8 for filling surface asperities of the piezoelectric element 1. Instead, the invention manufactures at least a portion of the carrier 2, i.e., forms and shapes it, within a mold 10 using a technique such as injection molding or a die cast while simultaneously exploiting the tendency of a molded casting material 3 to intrinsically change dimension and thus exert a preload. The change in dimension can cause the casting material 3 holding the piezoelectric element 1 to expand, contract, or otherwise deform during hardening or manufacturing in order to place a piezoelectric element 1 in compression, the element 1 being assembled concurrently with forming the portion of the carrier 2.

In a preferred embodiment, the carrier 2 is a single, coherent part manufactured from an amorphous casting material 3, advantageously from a polymeric or metallic compound. A compound can also comprise a composite material, including fiberglass or graphite epoxy composites, among others.

Figure 3:
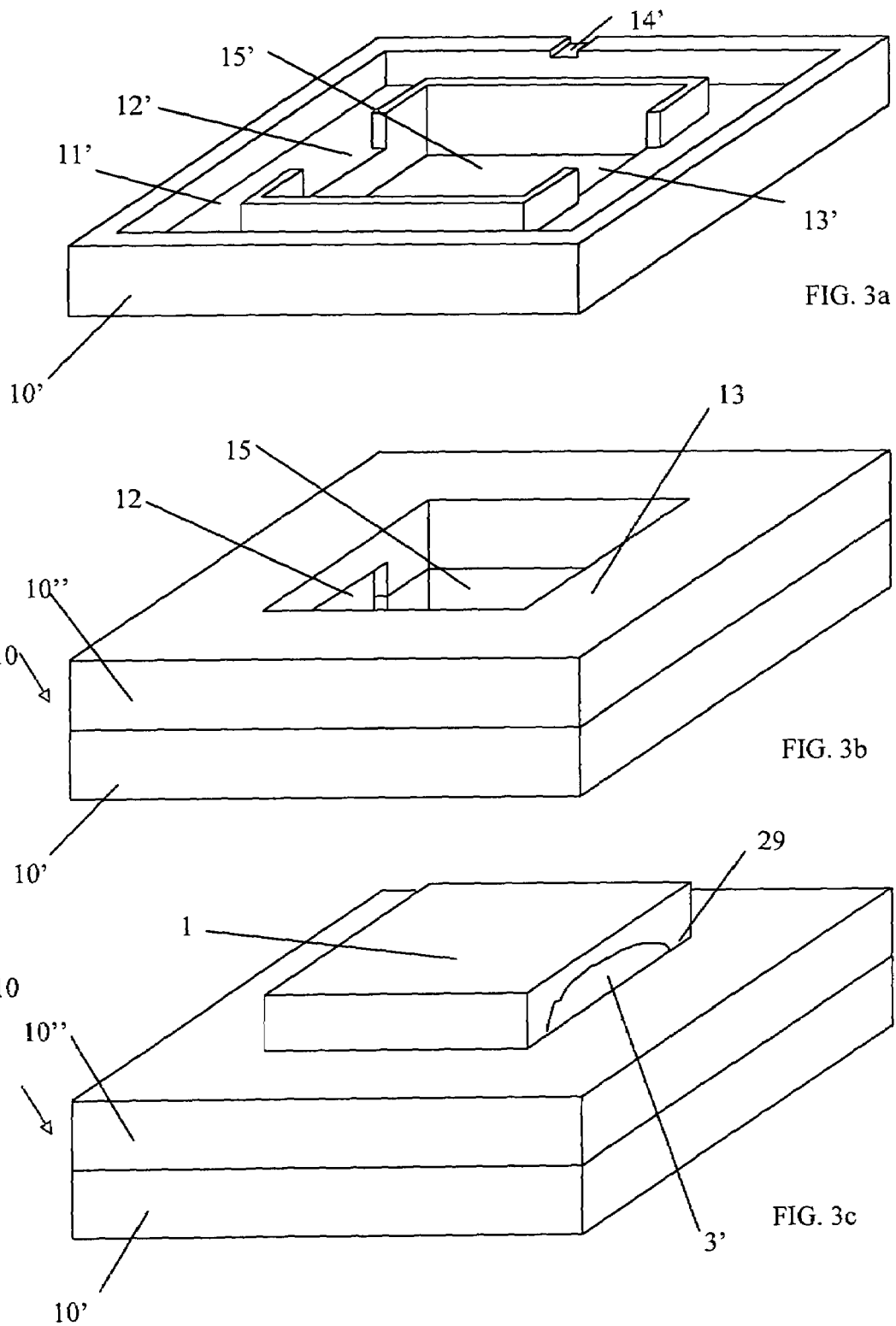
FIGS. 3a–3c illustrate a method of assembling a piezoelectric device using a moldable material and a separable mold with an opening for inserting a piezoelectric element.

FIGS. 3a–3c illustrate a method to manufacture an embodiment of the invention using a mold 10. A resulting piezoelectric device 7 is shown schematically in FIG. 4. Here, the mold 10 is separable into two partial molds 10' and 10" although more partial molds may be needed in some instances. A representative example of a partial mold 10' is shown in FIG. 3a. Partial mold 10" has similar features but does not have to be identical or symmetrical. Indeed, one of the partial molds may be a featureless plate, or a die or plunger so that the mold 10 may be used in a press-type manufacturing process or an injection-type manufacturing process. The mold 10 preferably has all the features that a person skilled in the art would recognize to be necessary for a particular molding process, such as for injection molding or for die casting. Some typical features of the mold 10 are disclosed to describe aspects of the invention, but the list is not exhaustive.

For example, it may be necessary to provide outlets or vents where air or other gases can escape from the mold during molding. For simplicity, such outlets are not explicitly shown in the figures. Also, successful processing of a moldable, liquid, powdery, granulated, etc., casting material 3 may include heating, cooling, chemical reactions, phase changes, mixing, coagulation and other processes that are known to a person skilled in the art.

The partial mold 10' has a channel 11' and usually at least one inlet 14'. In the illustrated embodiment inlets 14', 14" are used where a moldable casting material 3 is injected after the partial molds 10' and 10" have been assembled into a mold 10 with a cavity 11 formed by channels 11' and 11". In a plunger/die arrangement, where a protrusion on one of the partial molds 10', 10" fits into an indentation on the other partial mold, the casting material 3 is placed into the cavity 11 before the mold 10 is assembled. In either case, the casting material 3 is processed, solidifies and hardens to form at least a portion of the carrier 2 of the piezoelectric device 7 when the partial molds 10' and 10" are separated and the casting material 3 is released.

The mold 10 has an opening 15 to hold the piezoelectric element 1 therein during the molding process. The opening 15 is shown as extending trough the entire height of the mold 10 but that does not need to be so. The mold 10 is further shaped to form openings 12 and 13 where the moldable casting material 3 can escape the cavity 11 during manufacture of the piezoelectric device 7. The openings 12 and 13 are shown to be equal in shape, rectangular, and located on opposite sides of the opening 15 but need not be so as various locations and shapes can be used. The openings 12, 13 allow fluid communication with the opening 15 into which the piezoelectric 1 is placed in this embodiment.

Openings 12, 13, and 15 are shaped and located to allow the moldable casting material 3 to come in direct contact with the piezoelectric element 1, possibly allowing some casting material 3' to escape if there is a gap 29 (FIG. 3c) between the mechanical contact area of the piezoelectric element 1 and the inside walls of opening 15 around the openings 12 and/or 13. The gap 29 may be a selected feature of predetermined dimension, or it may be a consequence of geometric tolerances of the piezoelectric element and the portions of mold 10. Any gap 29 is preferably small otherwise an excessive amount of casting material 3 can exit the mold through the gap 29. The moldable casting material 3 and the associated molding process are selected to create a compressive force onto the piezoelectric element 1 due to an intrinsic urge that remains in the casting material 3 after hardening. In the present case, the casting material 3 is therefore selected to exhibit a certain amount of shrinkage during hardening. Shrinkage in the order of 0.1% or less may be sufficient to achieve a desired static preload in the piezoelectric element 1. Larger shrinkage amounts can help to increase the preload.

The preload is advantageously, but optionally sufficient to place the piezoelectric element in sufficient compression to operate the piezoelectric element over at least a normal range of operational frequencies and amplitudes suitable for the particular use to which the piezoelectric element 1 is put in a particular application or vibration system 7. As an electrical current is applied to the (polarized) piezoelectric element 1 the element can dynamically expand and contract and the total preload applied to the piezoelectric element 1 is advantageously sufficient to maintain the piezoelectric element 1 in compression during such expansion and contraction. Depending on the nature of the vibratory system into which the piezoelectric element 1 is placed, there may be normal operational parameters, and a more demanding set of outer limit parameters that account for unusual conditions under which the piezoelectric element must still function. The design parameters described herein use the normal operational parameters rather than the extreme environmental or use conditions to which a piezoelectric device is subjected or may be subjected to during use.

The casting material 3 preferably causes the entire amount of compression for the normal operational use and the normal parameters. Thus, the casting material 3 advantageously provides 100% of the static preload on the piezoelectric element 1. In less preferred embodiments the casting material 3 only accounts for a portion of the preload. Advantageously, the casting material accounts for at least 15% of the static preload under the normal limit parameters, and preferably accounts for a majority (over half) of such a preload, and more preferably accounts for over 90% of such preload, and ideally accounts for 100% of the preload using the normal operational parameters. There is always some uncertainty in measuring the preload and further variation arising from environmental and manufacturing tolerances and differences. Thus, the casting material advantageously accounts for about 15% or more of the static preload. The preload from the dimensional change of the casting material 3 advantageously offsets a substantial portion (about half or more) of the expansion stresses on the piezoelectric element 1 that arise during normal operation of the vibratory system, and preferably also offsets a substantial portion of the expansion stresses that arise during operation under the limit parameters.

The resulting compressive preload is advantageously selected to act along a direction of the piezoelectric element 1 that minimizes the risk of damage to the piezoelectric element 1 due to tensile stresses when an electrical signal is applied to the piezoelectric element 1 during operation of the device 7.

Figure 4:
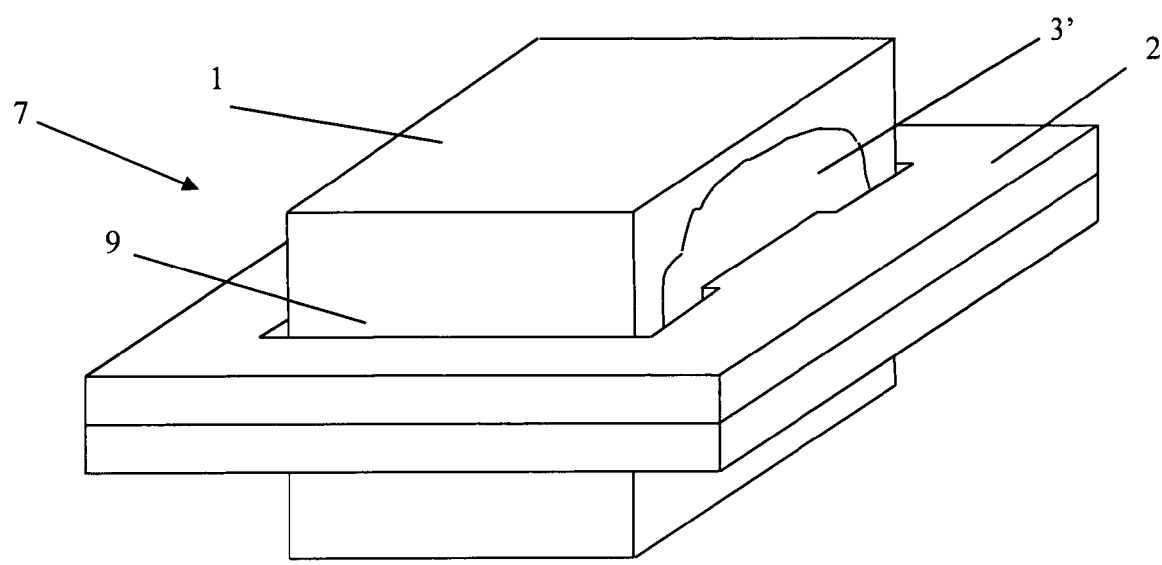
FIG. 4 shows a piezoelectric device that can be manufactured using the method of FIGS. 3a–3c.

Due to the layout of the mold 10, the carrier 2 in FIG. 4 contacts the piezoelectric element 1 only at selected contacting portions where the mold 10 openings 12 and 13 were located during manufacture of the carrier 2. In other words, the carrier 2 intrinsically has an opening 9 wherein the piezoelectric element is now located. The casting material 3 properties, the molding parameters, and the surface structure of the piezoelectric element are advantageously selected to cause at least one of chemical bonding, friction, or form-fit between the carrier 2 and the piezoelectric element 1 to prevent the piezoelectric element 1 from falling or slipping out of the opening 9. As shown in FIG. 4, the piezoelectric element 1 is held on opposing ends by opposing contacting points located on or formed on the carrier 2.

The carrier 2 is shown as having the basic shape of a ring with opening 9 forming the inside of the ring. Other shapes of the carrier 2 are possible as long as they afford themselves to a particular molding method and as long as they provide the carrier 2 with sufficient mechanical stability to sustain the intrinsically generated compressive preload on the piezoelectric element 1. For example, the carrier 2 can be given a "C" shape rather than the "O" shape shown in FIG. 4, with the piezoelectric element 1 located between the opening formed by the legs of the "C" rather than the inside of the "O." The advantage of using the molding method according to the invention is therefore that the carrier 2 can be given almost any shape while simultaneously putting the piezoelectric element 1 into a state of static compression without the need of additional preload mechanisms such as threaded bolts 6.

In use, the channels 11 are formed in partial molds 10', 10" which in turn are assembled to form mold 10, with the channels shaped so they form a carrier 2 of desired shape. The openings 12, 13 are sized and located in the mold 10 to allow the casting material 3 to form contacting portions with the piezoelectric 1. The piezoelectric 1 is in opening 15 in the mold 10, which results in the piezoelectric 1 being located in opening 9 in carrier 2. If desired, further walls could be provided to the mold 10 to limit the location, size and shape of the casting material 3 contacting the piezoelectric 1 to form the contacting portions with the piezoelectric element 1. Flowable casting material 3 is placed in the mold 10 at the outset or through inlet 14. The flowable casting material 3 flows out or is forced out the openings 12, 13 where it abuts the piezoelectric 1. As the flowable casting material 3 cools or cures, it typically shrinks, causing the contacting portions to move toward each other and placing the piezoelectric element 1 in compression. For example, the mold 10 can be filled through inlet 14 with a molten metal which extrudes out of openings 12, 13 to form contacting portions that abut the piezoelectric 1 inserted into opening 15. As the metal cools and hardens, it shrinks and causes the contacting portions to move closer together. As the piezoelectric 1 is located between the contacting portions, the piezoelectric 1 is placed in compression. By selecting the metal casting material 3 and other dimensions relative to the piezoelectric 1, a predetermined preload may be achieved.

The casting material 3 can be molten metal or plastic or other flowable materials. The casting material 3 can be inserted into mold 10 under pressure, as in die casting. The casting material 3 can be inserted into the mold 10 at room temperature, and then caused to melt and conform to the shape of the mold, as for example by applying heat, or by applying pressure, or both, as in forming polymers, sintered metal, sintered mixtures containing ceramics. The casting material 3 can be a chemical mixture (e.g., polymers) or compound or composite, such as concrete, which is poured into the mold 10 and allowed to cure, with a dimensional change occurring as the casting material 3 cures in order to place the piezoelectric element 1 in compression along a desired axis or exes. Usually the casting material 3 shrinks as cures or cools or hardens, but not always.

Further, the process of molding the carrier 2 around the piezoelectric 1 causes the contacting points between the carrier 2 and the piezoelectric 1 to form with a highly conforming contact shape. The carrier 2 conforms to the shape of the piezoelectric 1 at the contacting points. Depending on the casting material 3, the carrier 2 may be bonded or adhered to the mating surface of the piezoelectric 1. The carrier 2 thus advantageously has a uniformly shaped contact between the carrier 2 and the piezoelectric 1. Indeed, the carrier 2 can be molded to the piezoelectric 1, providing a highly uniform contact area in intimate and uniform contact with the piezoelectric 1. The highly conforming shapes of the carrier 2 at the location where it contacts the piezoelectric 1 avoids the need for mechanically passive interposed materials 8 to even out surface asperities on the piezoelectric element 1. For example, filling the mold 10 with molten metal will cause the contacting portions to conform to the mating surfaces of the piezoelectric element 1.

Figure 5:
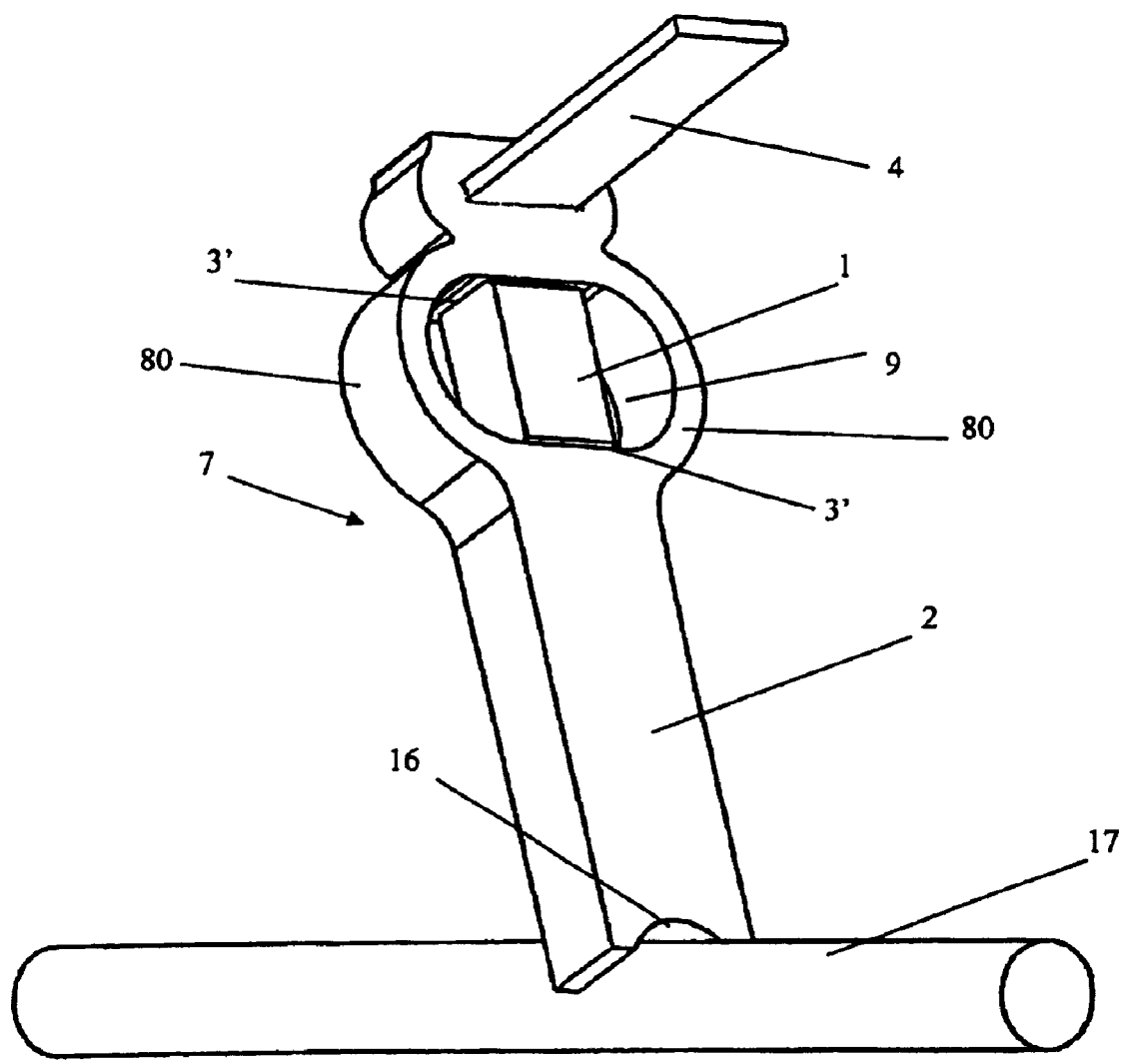
FIG. 5 shows an embodiment of the piezoelectric vibration device in a piezoelectric motor application.

The carrier 2 can form a mechanical resonator together with the piezoelectric element 1 to vibrate when a sinusoidal electrical signal is applied to the polarized piezoelectric element 1. For example, FIG. 5 shows an embodiment of the piezoelectric vibration device 7 comprising a carrier 2 having an elongated shape to serve as a mechanical resonator for the piezoelectric element 1. In this case, the casting material 3 is also selected so that sufficient mechanical vibratory energy is transmitted from the piezoelectric element 1 into the carrier 2 in order to set the entire piezoelectric device 7 in mechanical vibration. The casting material 3 parameters are further selected in conjunction with carrier 2 shape and other piezoelectric device 7 parameters to cause the piezoelectric device 7 to have predetermined resonance frequencies and resonance mode shapes.

By appropriately shaping the inside of the mold 10, the resulting molded carrier 2 can further exhibit fastening features 4, made from the same casting material 3 as the carrier 2, in order to mount the device 7 to a base (not shown) during use of the system. Such a fastening feature 4 may comprise clips or through-holes for bolts, screws, rivets, or a variety of other mounting mechanisms. As illustrated, the fastening feature 4 comprises a leaf spring, the distal end of which is mounted to the base (not shown) during use. Other fastening methods are known to a person skilled in the art. In the embodiment shown in FIG. 5, the carrier 2 is shaped to exhibit a fastening feature 4 that is also a flexible appendage, which mounts the piezoelectric device in a resilient fashion. A resilient mount is typically needed if the piezoelectric device 7 serves as a piezoelectric vibratory motor for moving a driven element 17 as shown in FIG. 5. A preferred embodiment therefore is a piezoelectric device 7 wherein the carrier 2 and a flexible mounting appendage or fastening feature 4 are formed concurrently while the piezoelectric element 1 is simultaneously placed in compression in the same manufacturing process. Thus, the carrier 2 can be molded to the preexisting piezoelectric 1 and mounting or fastening feature 4 (e.g., a leaf spring of spring steal). Alternatively, the carrier 2 and mounting feature 4 can be simultaneously formed or molded around the preexisting piezoelectric 1 in which case the fastening feature 4 is of the same casting material 3 as the carrier 2, and formed integral with the carrier 2.

The carrier 2 in FIG. 5 has as an additional moldable feature that helps conform the vibrating carrier 2 to mate with the driven element 17. As shown, a cylindrically shaped indentation, or mating surface, 16 is formed, preferably but optionally, by molding simultaneous with the carrier 2, at the distal end of the carrier 2. In a vibratory motor to drive a movable element 17, such as disclosed in PCT Publication WO03/028199A2, similar mating surfaces 16 mate with the shape of the driven mechanical contact and to guide the driven element 17. In this context, casting material 3 properties can be selected that are advantageous for piezoelectric motor operation, which is based on mechanical friction between the driven element 17 and the carrier 2. To that end, the casting material 3 and/or the driven element 17 may comprise filler materials, lubricants, etc., in order to achieve optimal friction behavior. Typical fillers for polymeric casting materials 3 are glass fibers or spheres, carbon fibers or dust, or mineral compounds. Alumina particles may be used as filler for metallic casting materials 3. This list is not exhaustive. Further, the use of powdered metals and compression of polymeric beads into variable property polymers allows forming the carrier 2 with casting material 3 having properties that may vary. Thus, the mating surface 16 may be formed with lubricants embedded in the casting material 3, while other portions of the carrier 2 have material compositions more suited to achieve the desired strength and vibration characteristics of the carrier 2.

Figure 6:
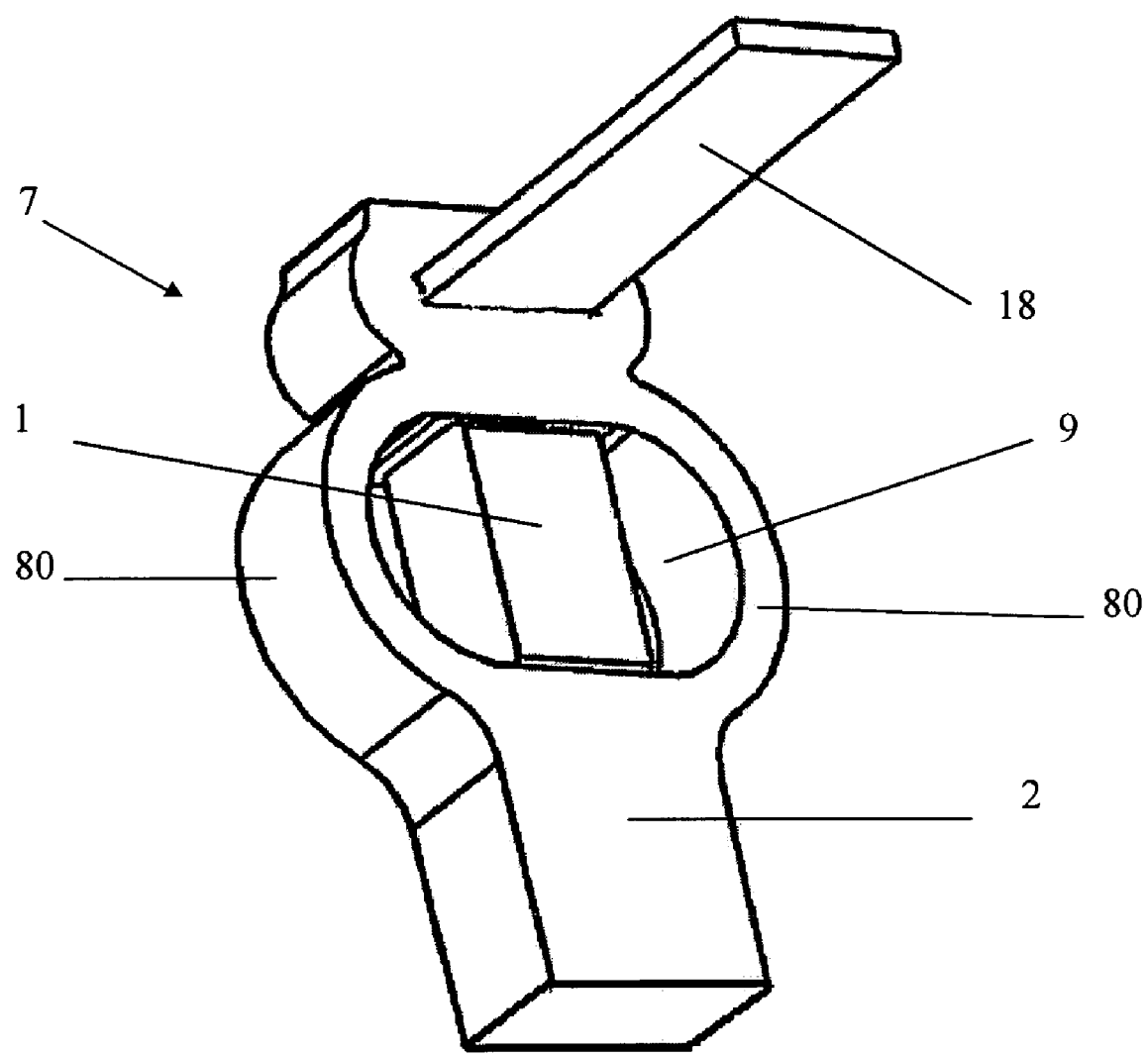
FIG. 6 shows another embodiment of the piezoelectric vibration device.

Referring to FIG. 6, while the carrier 2 is being formed in the mold 10, it can concurrently be equipped with prefabricated fastening inserts 18 that are placed into an appropriately shaped mold 10. FIG. 6 shows, for example, an embodiment comprising a separately manufactured fastening insert 18 that is a resilient mount that has been placed into a mating opening (not shown) in the mold 10 and bonded to the carrier 2 concurrently with the piezoelectric element 1. If the fastening insert 18 is a hollow tube it can serve as a reinforced fastening point for the device 7. Depending on the use of the pre-manufactured fastening insert 18, it can be the same as a molded fastening feature 4.

With respect to FIG. 6, the influence of temperature changes is exemplified. When a preformed carrier 2 is heated, the material typically expands, and it contracts when cooled. Heating and cooling thus can subject the piezoelectric element 1 to the desired static preload compression. Further, when hot most materials are softer than when cooled. While that may seem to fit within the characteristics of the casting material 3, the casting material is not used when the carrier 2 is entirely preformed. Thus, as used herein the change in state of the casting material 3 during cooling, curing, or hardening does not encompass the thermal changes of a carrier 2 that is entirely preformed and that does not include any casting material 3, unless otherwise specified or stated.

The carrier 2 shown in FIG. 6 could be made entirely of casting material 3, or it could be made using a partial preformed carrier 2 as well as using casting material 3, or it could be made using an entirely preformed carrier 2 and no casting material 3. The opening 9 of carrier 2 is in part formed by opposing sidewalls 80 on either side of the piezoelectric 1. The sidewalls 80 can be curved or straight. These side walls 80 typically extend when heated and contract when cooled, which changes the dimensions of the opening 9. Having curved sidewalls 80 may help to enhance this effect because the length of a curved sidewall is greater than the chord of the curved sidewall. Therefore, if the piezoelectric element 1 is inserted into the opening 9 while at least the sidewalls 80 are hotter than the expected operating temperature range of the final piezoelectric device 7, subsequent cooling lets the sidewalls 80 shrink and causes an additional preload on the piezoelectric element 1. Since many operating temperatures are typically in the room temperature range, or the environmental temperature range, and since molding temperatures are typically far greater than the maximum environmental temperatures, the use of curved sidewalls 80 offers an additional way to vary the preload on the piezoelectric element 1 using the casting material 3 to form at least the side walls 80 or other portions of the carrier 2, or curved side walls 80 can be used in an entirely pre-formed carrier 2 without the use of casting material 3. In the earlier cases where the material 3 is used, inserting the piezoelectric element 1 may be done by the molding methods disclosed herein.

In the prior art, if an entirely pre-formed carrier 2 is used, the piezoelectric element 1 can be inserted into the pre-fabricated carrier 2, for example, by a press-fit, in order to achieve the desired static preload. But this static preload can preferably be achieved using an entirely pre-fabricated or pre-formed carrier 2 by heating the entire carrier, or heating portions of the carrier, to an elevated temperature sufficient to allow the insertion of the piezoelectric element 1, with later cooling of the carrier 2 to room temperature or operational temperature causing sufficient dimensional change to cause the desired static preload on the piezoelectric element 1.

Figure 12:
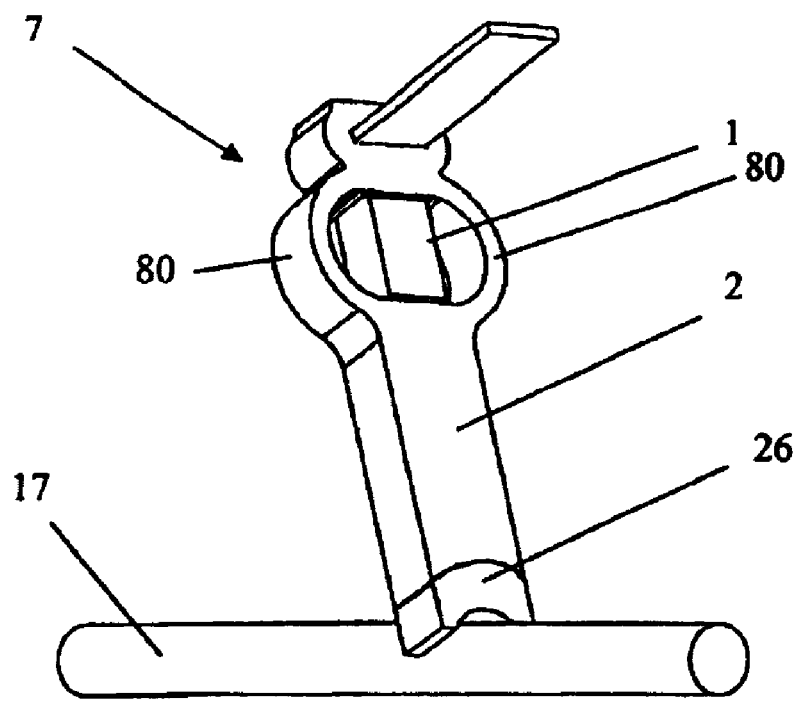
FIGS. 12a and 12b show embodiments of the invention comprising various inserts.

The amount of temperature increase to achieve this predetermined static preload will vary with the material of the pre-formed carrier 2, the length of the carrier 2 that is heated, and the size of the piezoelectric element 1. For example, the temperature required to achieve a desired preload will be less if the carrier has longer, curved sidewalls surrounding the piezoelectric and holding the piezoelectric element 1 in compression, as shown in FIG. 5, than if a similarly constructed carrier has straight sidewalls. Further, the piezoelectric element 1 can be cooled to cause it to shrink, or an appropriate voltage could be applied to cause the piezoelectric element 1 to shrink in order to place the piezoelectric element 1 in the carrier 2. The temperature induced static preload also preferably achieves all of the desired static preload, and advantageously achieves about 90% or more of the preload, and less advantageously but optionally achieves about half the static preload. FIG. 12a exemplifies an embodiment comprising a mating insert 26 in the carrier 2 that has one end shaped to engage a driven element 17 during use of the device 7 as a vibratory motor. The mating insert 26 is a pre-manufactured part that is connected to the carrier 2 concurrently with and in the same fashion as a fastening insert 18 or as the piezoelectric element 1. The mating insert 26 then replaces the mating surface 16 on the carrier 2 as shown in FIG. 5 and has properties that support moving the driven element 17. To make it easier to fasten the mating insert 26 or the fastening insert 18 to the carrier 2, the end of the mating insert 26, 18 embedded in the carrier 2 may have one or more tangs, protrusions or holes to allow the casting material 3 forming the carrier 2 to better mate with and hold the mating insert 26, 18 as the casting material 3 flows in or is otherwise forced to conform to the shape of mold 10.

Figure 12B:
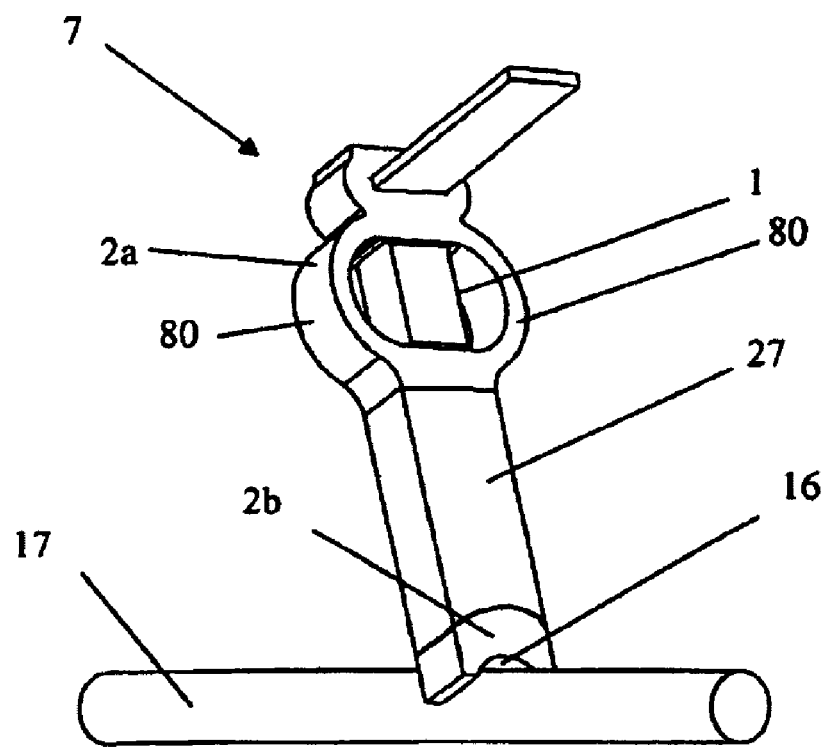

FIG. 12b shows a further embodiment wherein the carrier 2 is effectively divided into disjoint portions 2a and 2b that are not continuously connected by the casting material 3 but by a connecting insert 27 instead that transmits the motions generated by the piezoelectric element 1 during operation of the piezoelectric device 7. In some cases, it may be useful to select the properties of connecting insert 27 to reduce the transmission of vibratory motions in order to insulate portions 2a and 2b from each other in a vibratory sense. The connecting insert 27 can be fastened to the carrier 2 and distal, mating insert 26 by mechanical means such as threaded fasteners, removable lock mechanisms, welding, adhesives, and other permanent and removable fastening mechanisms and methods known to those skilled in the art. Further, the connecting mating insert 26 could be integrally molded with the carrier 2 as described above relative to mating insert 26 and fastening feature 4.

Other inserts with other usages can be assembled into the piezoelectric device 7 concurrently with and in the same fashion as the piezoelectric element 1 using a molding method.

Figure 7A:
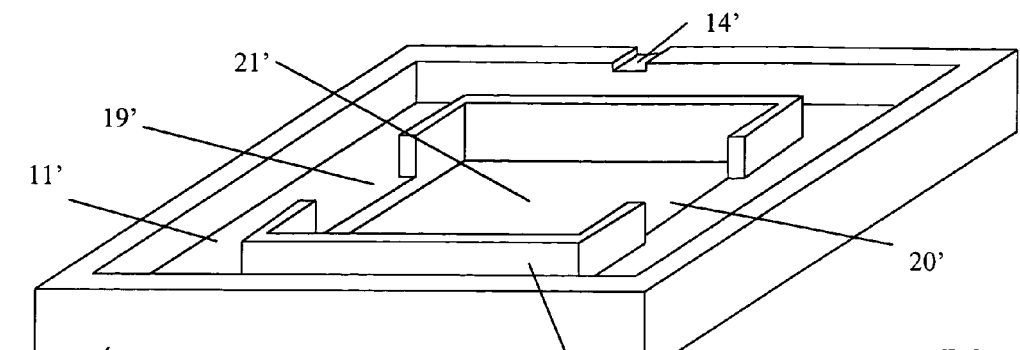
FIGS. 7a–7c illustrate a further method of assembling a piezoelectric device using a mold wherein the mold fully encloses the piezoelectric element.
Figure 7B:
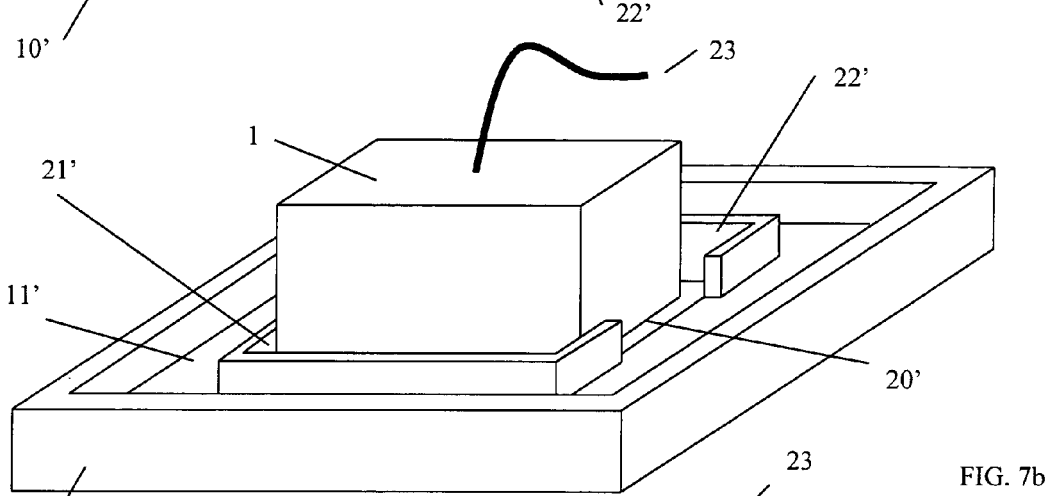
Figure 7C:
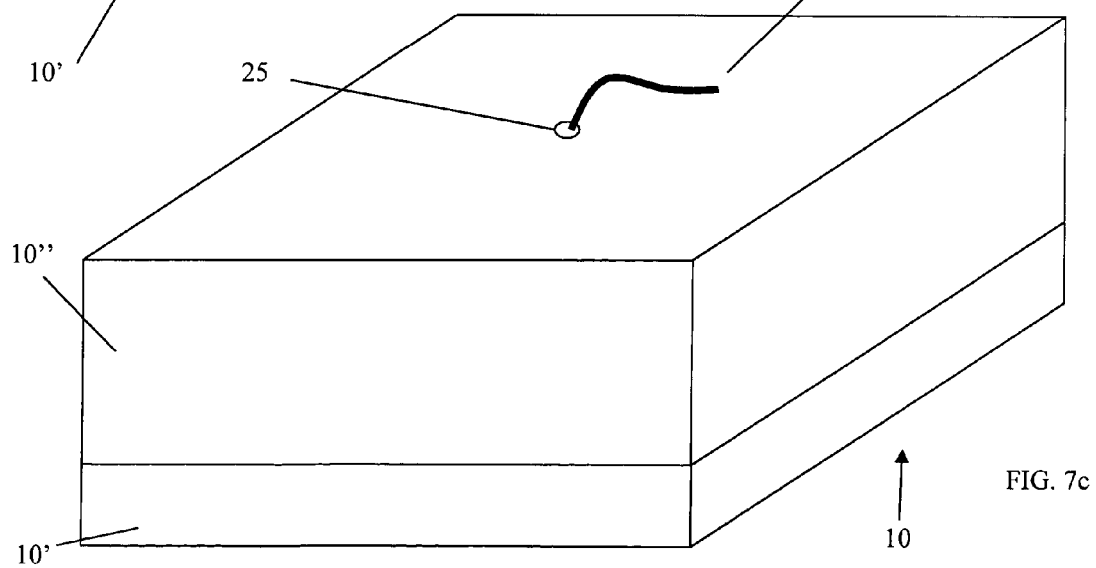
Figure 8A:
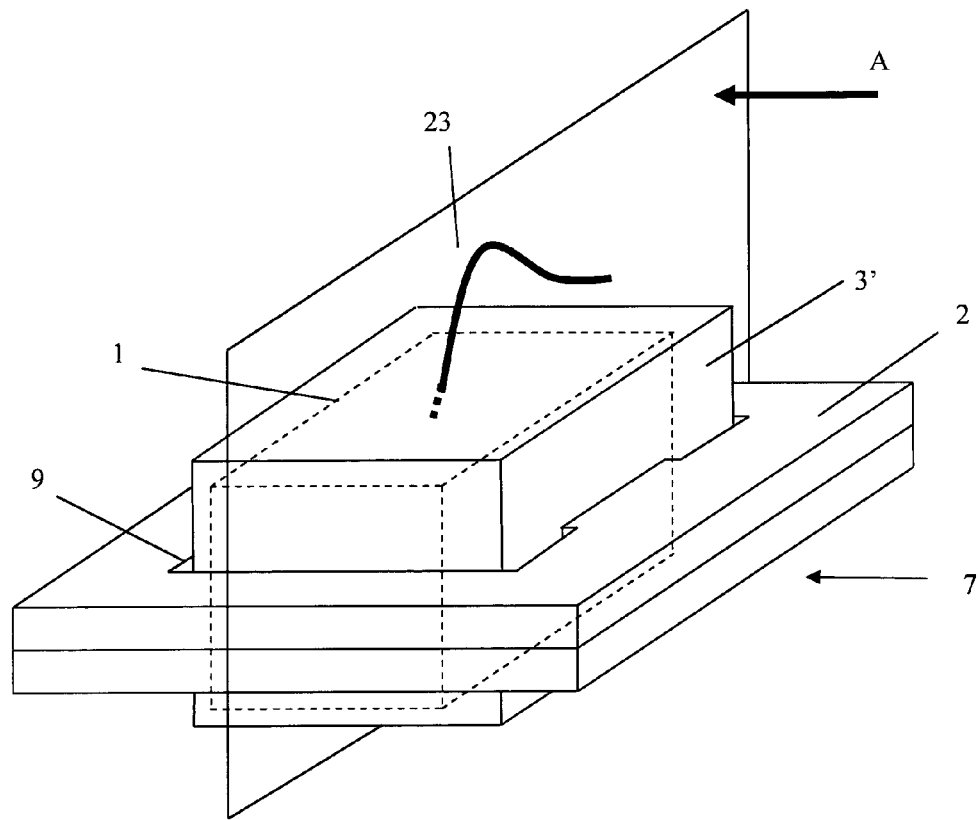
Figure 8B:
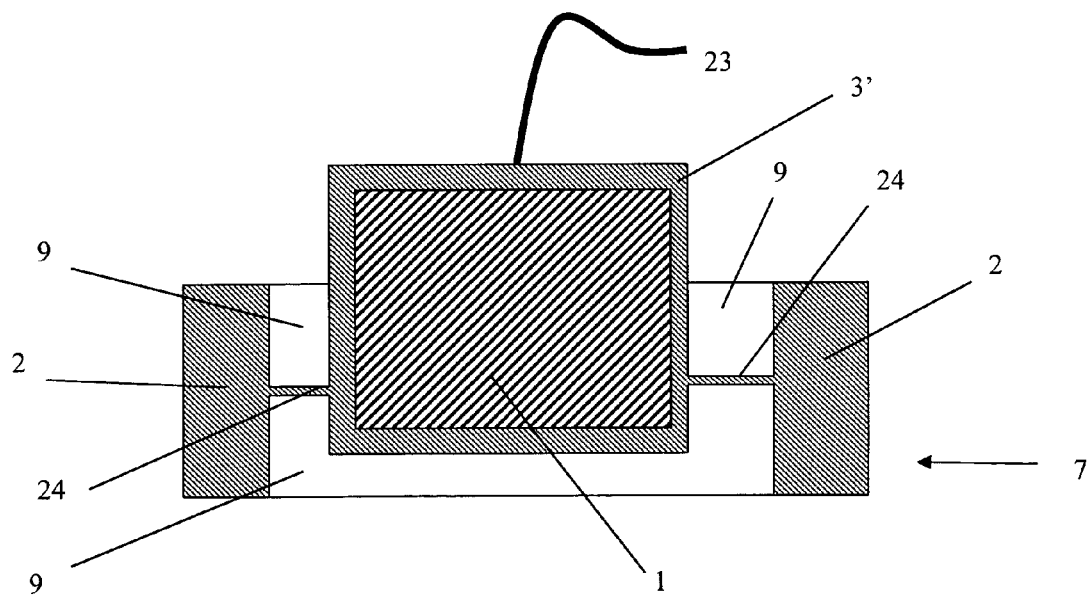

FIGS. 7a–7c illustrate a molding method for manufacturing a piezoelectric device 7 as shown in FIGS. 8a–8b. Both are variations of the method shown in FIGS. 3a–3c and the piezoelectric device 7 shown in FIG. 4. Here, the opening 15 in the mold 10 is replaced with a enclosed cavity 21 that is connected through orifices 19 and 20 to the cavity 11 and is separated by walls 22 from cavity 11. As before, the primed numbers in the figures refer to the corresponding features in the partial molds. According to this embodiment, the piezoelectric element 1 is placed into the cavity 21 before the partial molds 10' and 10" are assembled into the mold 10. The casting material 3 is either introduced into the mold 10 cavities at the outset or through inlets 14. The mold 10 advantageously has additional features such as spacers on the inside walls of the cavity 21 to hold the piezoelectric in place during molding.

The resulting piezoelectric device 7 is exemplified in FIG. 8. In this embodiment, the piezoelectric element 1 is completely enclosed by the amount 3' of casting material 3 that has passed through the orifices 19 and 20 into the cavity 21 to surround the piezoelectric element 1. However, the arrangement of the piezoelectric element 1 within the cavity 21 and the process parameters, can be selected to let the hardened casting material 3' only partially enclose the piezoelectric element 1. Alternatively, further walls 22 could be provided to limit the location, size and shape of the casting material 3 contacting the piezoelectric 1 and forming the contacting portions with the piezoelectric element 1. The advantage of a partial enclosure is that the piezoelectric element 1 is accessible to be connected to electrical wires 23 to supply an electric voltage to the piezoelectric element 1.

The advantage of a complete enclosure is that the piezoelectric element is protected from certain environmental factors such as humidity or dust. In the case of complete enclosure, some of the casting material 3' needs to be removed or perforated to allow electrical wires 23 to be connected. Alternatively, at least one opening 25 in the mold 10 can be provided so that wires 23 may be connected and led to the outside prior to introducing a moldable casting material 3 into the mold 10.

If the casting material 3 is electrically conductive, a voltage can be applied to the piezoelectric element 1 through the casting material 3. Another, second electrical connection to the piezoelectric element 1 needs then to be properly insulated from the electrical connection formed by casting material 3.

FIG. 8b shows a cross-section of a fully enclosed piezoelectric device 7, the cross-section having been taken along the plane perpendicular to axis A as shown in FIG. 8a, to illustrate that the piezoelectric element 1 does not have to be centered within an opening 9 of the carrier 2 and that the piezoelectric does not have to be symmetrically held within the opening 9. Also, if the walls 22' and 22" of the respective partial molds 10' and 10" are dimensioned to leave a gap between them when the mold 10 is assembled, then bridges 24 comprising the hardened casting material 3 remain in the carrier 2. The dimensions of bridges 24 can be selected to shape the mechanical vibration properties and other properties of the piezoelectric device 7. The bridges 24 may form a continuous or partial divider of the opening 9 in the carrier 2. A continuous divider 24 can prevent liquids, gases or dust to pass from one side of the device 7 to the other side. Bridges 24 may also lend some elastic flexibility akin to a membrane to the piezoelectric device 7.

If the piezoelectric element 1 is polarized prior to molding, an electrical signal may be applied through electrical connections 23 to cause the piezoelectric element 1 to expand, to contract or both and to ultimately assist the molding process. For example, a selected electrical signal may affect the flow of the casting material 3, its hardening behavior, or the way that it cures. The spatial filler material distribution in a hardened composite casting material 3 may be affected in that way. Other factors affect the ultimate filler distribution, such as local flow rates, and are known to a person skilled in the art. A slight vibration of the piezoelectric element 1, for a defined period of time during the molding process, may cause casting material 3 to flow better or cure better. Similarly, an applied constant voltage may cause the piezoelectric element 1 to contract a defined amount, and may thus be used to increase the preload caused by the carrier 2. Likewise, an applied constant voltage may cause the piezoelectric element 1 to expand a defined amount, and may thus be used to decrease the preload caused by the carrier 2. The application of an electrical signal or a fixed voltage to the piezoelectric element 1 during molding of the casting material 3, in order to vary the compression on the piezoelectric element 1 caused by the carrier 2, can be used with each of the embodiments disclosed herein.

There is thus provided a method for manufacturing a piezoelectric vibration device 7 comprising a carrier 2 holding a piezoelectric element 1 in static compression, wherein the piezoelectric element 1 is placed into a mold 10 and a moldable casting material 3 is molded into the carrier 2 while simultaneously developing an intrinsic urge, e.g., by shrinking, during hardening to cause the compressive force onto the piezoelectric element 1. Additionally, inserts such as inserts 18, 26, or 27 may be placed into the mold to connect them to the carrier 2 while the carrier 2 is being formed.

Figure 18:
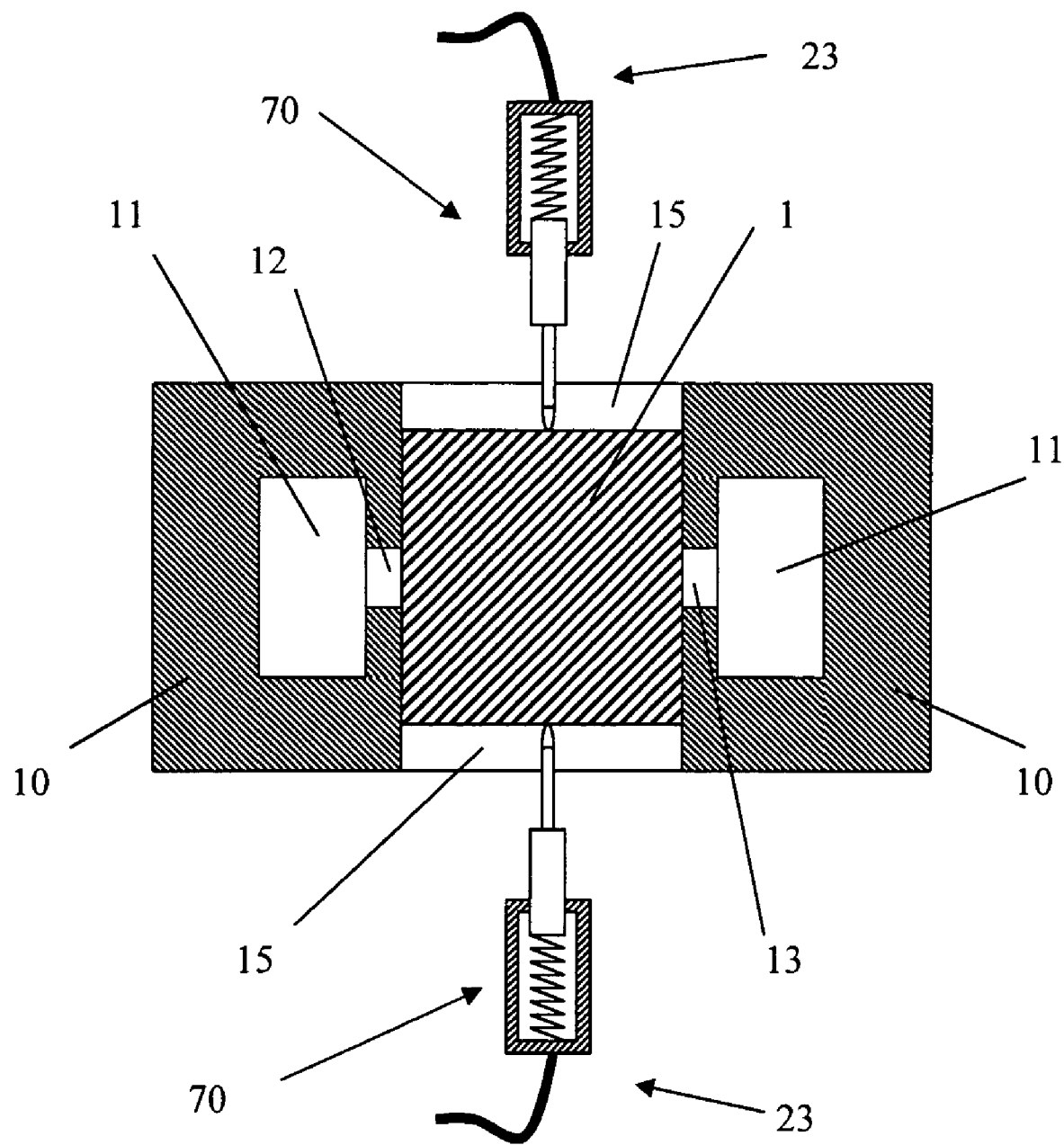
FIG. 18 partially illustrates a configuration wherein the piezoelectric element is supported by spring-loaded pins during manufacture of the piezoelectric device.

In a further improvement, the piezoelectric element 1 may be held in place during molding of the carrier 2 by electrical connections 23 provided to the piezoelectric element 1 during molding. In addition to the pre-connected electrical wires 23, these electrical connections 23 can also comprise spring loaded conductive pins 70 that are temporarily urged against the electric contacts of the piezoelectric element 1 to hold the piezoelectric element 1 in place during molding. The use of such pins 70 is illustrated in FIG. 18, where a cross-section through a mold 10 with cavity 11 is shown. The mold 10 shown here is comparable to that of FIGS. 3a–3c. The mold 10 further comprises an opening 15 for holding a piezoelectric element 1 during processing of a casting material 3 and orifices 12 and 13 to allow fluidic communication between the piezoelectric element 1 and the cavity 11. The pins 70 resiliently position the piezoelectric element 1 within the opening 15 of the mold 10. The pins 70 and the mold 10 are supported, too, but these supports are not shown in the figure. After molding, the pins are released to allow the piezoelectric device 7 to be un-molded. The pins 70 can be made of a non-conductive material if they are only used for temporarily positioning the piezoelectric element 1.

Polymeric casting materials 3 that can be used for injection molding include thermoset, duroplastic and thermoplastic materials. Filler materials in composite casting materials 3 include glass fibers or spheres, carbon fibers or powder, and minerals. It is advantageous to select casting materials 3 that exhibit little creep to prevent a reduction of the static preload on the piezoelectric element 1 over the useful lifetime of the piezoelectric device 7. It is also advantageous if the casting material 3 is resistant to the environmental factors that the device 7 is exposed to during its useful life. It is advantageous to select casting material 3 properties and carrier 2 shapes, especially their mechanical impedances, to maximize the transmission of mechanical wave energy from the piezoelectric element 1 into the vibration device 7. Metals believed suitable for the casting material 3 include aluminum, zinc, steel and other metal alloys, molded hot or by powder metallurgy. Molding portions of the carrier 2 from a metal that has an amorphous (glassy), rather than crystalline, structure may be particularly advantageous in piezoelectric devices 7 that demand high yield strength and hardness and/or high corrosion and wear resistance. Especially piezoelectric vibration devices 7 operating close to a resonance frequency and/or functioning as a piezoelectric motor frictionally moving a driven object 17 profit from the acoustical properties of amorphous metals. Ceramics can also be used as casting materials 3.

Figure 10:
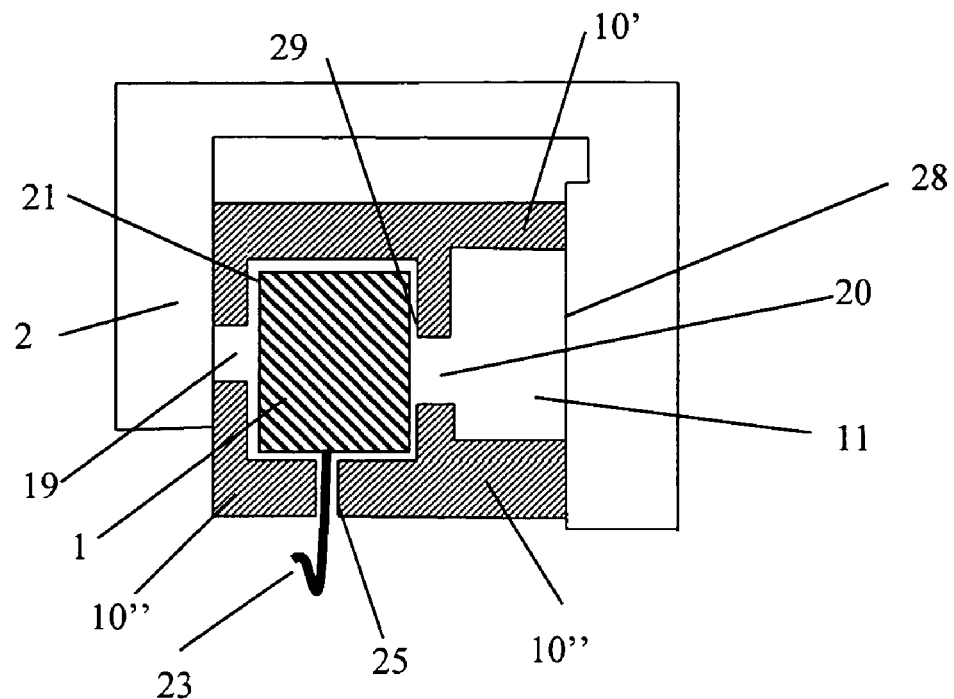
FIG. 10 illustrates a variation of the method of FIGS. 9a–9c, wherein the mold fully encloses the piezoelectric element.
Figure 11:
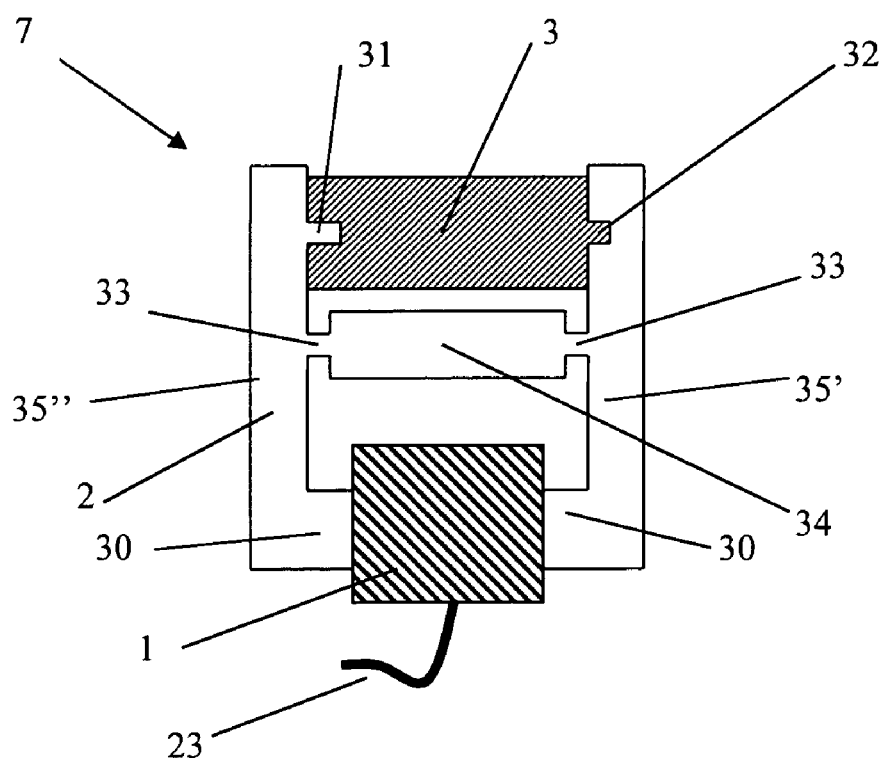
FIG. 11 shows another embodiment of the piezoelectric device manufactured according to the invention.

FIGS. 9–11 illustrate schematically further variations of the manufacturing methods disclosed so far. The principal distinction lies in the cause of the compressive force on the piezoelectric element 1. Whereas shrinkage of the casting material 3 during hardening or cooling or curing is used in the above described embodiments, an expansive urge that intrinsically remains in the hardened casting material 3 is used in the methods described by FIGS. 9–11. For example, a foaming agent can create an intrinsic gas pressure causing the carrier 2 to expand rather than shrink. Alternatively, if the casting material 3 is molded under great pressure, it is compressed in the process, and the compression can cause the intrinsic expansive urge of the casting material 3 that places the piezoelectric element 1 in compression.

The method and apparatus illustrated in FIGS. 9a–9c interposes a moldable casting material 3 between the piezoelectric element 1 and a pre-fabricated carrier 2. The pre-fabricated carrier 2 is shown as having a generally C-shape frame with the piezoelectric element 1 placed in the open portion of the C, along with the casting material 3. The pre-formed carrier 2 resists or restrains expansion of the casting material 3 in order to place the piezoelectric element 1 in compression. The pre-fabricated carrier 2 preferably, but optionally has a protrusion 30 that abuts one surface of the piezoelectric 1. An opposing surface abutting the piezoelectric 1 is formed or molded onto the pre-fabricated carrier 2 by using an optionally separable mold 10 having a cavity or channel 11 that borders against one face 28 of the carrier 2 opposing the protrusion 30. The protrusion 30 on the pre-formed carrier 2 is located opposite the channel 11 in this illustrated configuration. The mold 10 has an orifice 12 through which the casting material 3 can pass from the channel 11 to contact the piezoelectric element 1 during molding. If needed, a gap 29 between the mold 10 and the piezoelectric element 1 allows a certain amount 3' of casting material 3 to escape in order to accommodate geometric piezoelectric element 1 tolerances, to improve the bond between the piezoelectric element 1 and the casting material 3 and to ultimately help prevent the piezoelectric element 1 from falling out of the device 7 after its manufacture. Suitable walls or portions of mold 10 can be used to limit the size, shape and location of this casting material 3' flowing from the gap 29. On the other hand, tight tolerances or a feature such as a flexible sealing lip prevents escape. Escape of casting material 3 along the surface 28 may be permitted or be prevented with appropriate measures known to those skilled in the art.

The embodiment shown in FIG. 9c comprises a carrier 2 with a protrusion 30 for contacting one side of the piezoelectric element 1. The contact surface of the pre-formed protrusion 30 is advantageously smaller than the corresponding surface of the piezoelectric element 1 to improve the mechanical contact to the piezoelectric element 1. This is especially true if the piezoelectric element 1 has a monolithic multilayer construction, which may have an outwards concave, rather than flat, contact surface due to the internal electrode structure of a multilayer construction. To that end it may also be advantageous if the contacting surface of the protrusion 30 has a concave shape matching or opposing the shape of the abutting surface of the piezoelectric 1. The goal is to identically and reliably reproduce piezoelectric devices 7 that are built by the same method. The formed or molded contact surface opposite preformed protrusion 30 can be smaller than, the same size as, or larger than the abutting surface of the preformed protrusion 30.

The embodiments of FIGS. 9a–9c use an expanding casting material 3 to urge the piezoelectric 1 against a preformed portion of the carrier 2. The expanding casting material 3 expands against the piezoelectric 1 and the pre-formed carrier 2 so that the pre-formed carrier 2 acts like a spring to help vary or control the preload exerted on the piezoelectric 1. In the depicted embodiments of FIGS. 9a–9c, the pre-formed portion of carrier 2 has a generally C shape or U shape, with the piezoelectric 1 and expandable casting material 3 both located in the space between the distal ends of the C or U shape. The expanding casting material 3 forming a portion of the carrier 2 in FIGS. 9a–9b could also be formed on each of the opposing sides of the piezoelectric 1 using the disclosure herein and the skill of a person skilled in the art.

Note that the method and apparatus illustrated by FIGS. 9a–9c may require molding features that are not shown but that are known to a person skilled in the art as being necessary for a successful mold. This is especially so as the shape of the carrier 2 can vary and each such different shape of carrier 2 may require different molds 10.

It may be advantageous in any of the proposed methods or apparatus to additionally place an adhesive or some other compound on the mechanical contact regions of the piezoelectric element 1 to improve the bond to a carrier 2 and/or to even out surface asperities. Temporarily, a glue-like substance may help to maintain the location of the piezoelectric element 1 or other inserts with respect to a mold 10. Further, depending on the materials from which the carrier 2 and piezoelectric 1 are made, the materials may not lend themselves to forming a good bond, and if so it may be desirable to use an intervening bond-facilitating material that increases the bonding between the carrier 2 and piezoelectric 1 or that takes the form of something to which the piezoelectric 1 and casting material 3 can each bond.

FIG. 10 is a variation on the manufacturing method of FIGS. 9a–9c. Here a pre-formed carrier 2 is used, but further portions of the carrier 2 are formed using the casting material 3 to completely or partially encase the piezoelectric element 1 from some or all sides. In this further embodiment the expandable casting material 3 encloses at least a portion of the piezoelectric 1 or it could enclose opposing sides of the piezoelectric 1, but in either case expansion of the casting material 3 places the piezoelectric 1 in compression as it expands against the preformed carrier 2. The expandable casting material 3 and piezoelectric 1 are located between opposing legs of a C shaped or U shaped, preformed carrier 2 so that expansion of the casting material 3 causes the C or U shape to open slightly, which places the piezoelectric 1 and expanding casting material 3 in compression. The preformed portion of the carrier 2 resists expansion of the casting material, placing the piezoelectric 1 in compression. Depending on the configuration of the contacting portions of the pre-formed carrier 2 and the mold 10 and the expandable casting material 3, the pre-formed carrier 2 can also be used to vary the compression of the piezoelectric 1.

The embodiment of FIG. 10 could also be used with a casting material 3 that shrinks as it hardens or cures or cools, as the shrinking casting material 3 will shrink around and squeeze or compress the piezoelectric 1. It may be advantageous to apply a mold release agent to ensure the casting material 3 does not stick to the mold 10. The use of a suitable mold release agent depends on whether it is desirable to increase or decrease any bonding between the mold 10 and the casting material 3. What comprises a suitable mold release agent will vary depending on the materials used for the mold 10 and the casting material 3. The application of suitable mold release agents may be useful in all molding methods disclosed herein.

In some instances it may be advantageous not to remove the mold 10 after molding so that the mold 10 becomes an integral part of the piezoelectric device 7. In particular when the casting material 3 is molded under pressure, retaining the mold 10 may help to preserve at least a portion of the pressure so that the casting material 3 develops an intrinsic expansive urge that places the piezoelectric element 1 in compression.

It may not be necessary to use a mold 10 at all if the viscosity of the casting material 3 is so high when being processed that a desired final shape of casting material 3 can be achieved without a mold 10.

Figure 19A:
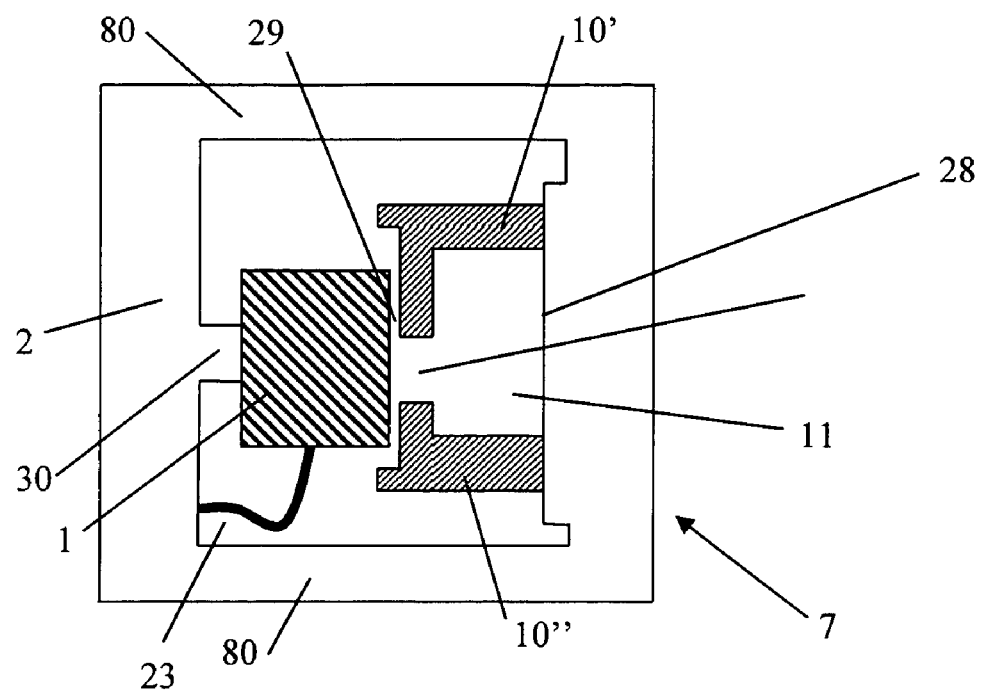
FIGS. 19a–19d shows further embodiments of a piezoelectric comprising O-shaped carriers.
Figure 19B:
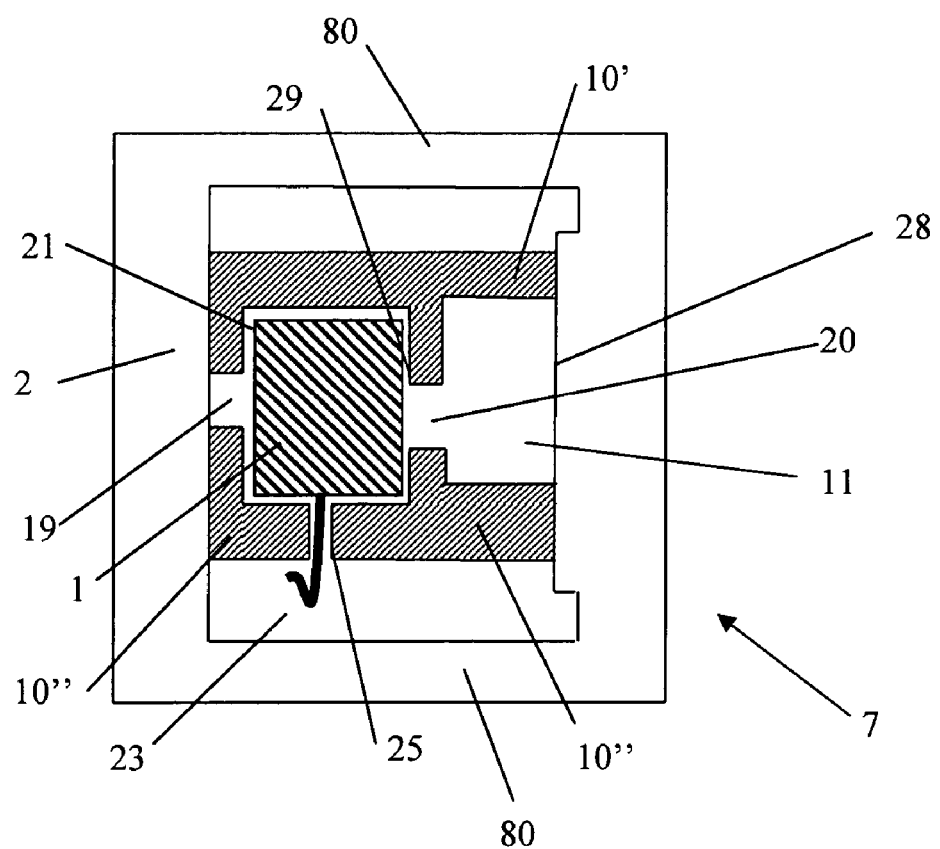

FIGS. 19a–19d are variations on the embodiments shown in FIGS. 9a and 10 wherein the carrier 2 has a largely symmetric, O-shaped form comprising an opening 9 (not marked) to hold the piezoelectric element 1, rather than having a C or U-shaped form as in FIG. 9a or 10. FIG. 19a is a similar variation on the embodiment of FIG. 9a, and FIG. 19b is a similar variation on the embodiment of FIG. 10. FIG. 19a applies the carrier material 3 to expand from only one side of the piezoelectric element 1 after the molds 10', 10" are removed. The embodiment of FIG. 19b has the forms 10', 10" enclose at least two opposing sides of the piezoelectric element 1, and preferably enclosing four or six sides of the piezoelectric element 1.

Using a ring-shaped carrier 2 has the advantage that the piezoelectric element 1 can more easily be placed in symmetric loading conditions, and that helps to prevent shearing stresses and/or bending loads on the piezoelectric element 1. Further, by encircling the piezoelectric element 1 a stiffer carrier 2 is provided, so that smaller dimensional changes caused by the casting material 3 result in larger preloads on the piezoelectric element 1. While the configurations shown are symmetric about an axis through the piezoelectric element 1, they need not be so. But symmetric carriers 2 are preferred because the symmetric shape is more likely to apply symmetric loading to the piezoelectric element 1, and a symmetric load is less likely to have bending and shear forces which can be detrimental. Further, the symmetric carrier 2 is more likely to have predictable resonances and thus more useful for creating piezoelectric devices 7.

Figure 19C:
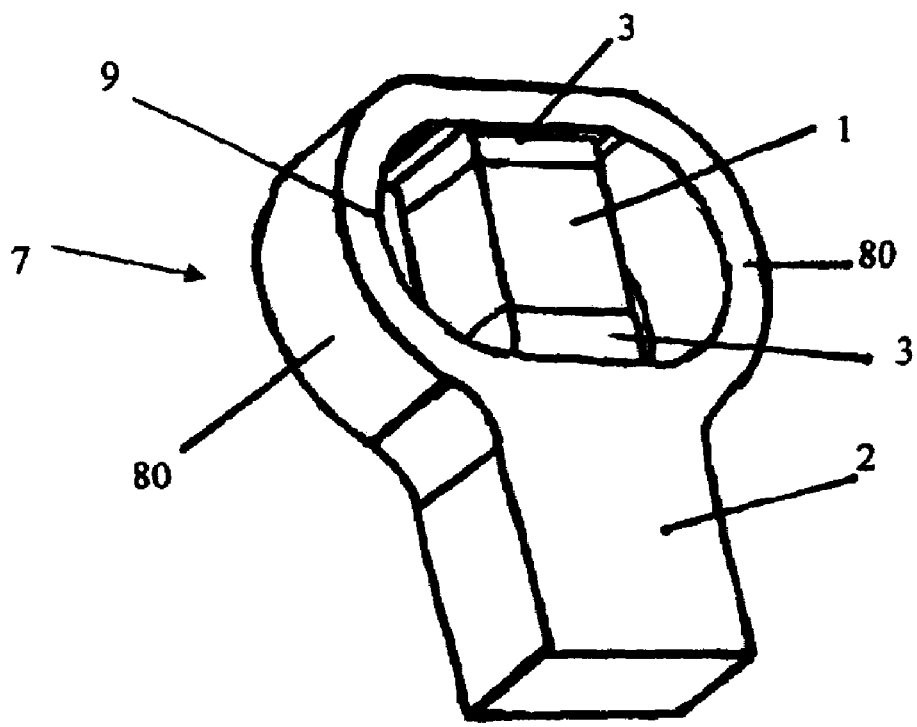

FIG. 19c shows a preferred embodiment that combines the manufacturing method exemplified in FIGS. 10 and 19b with features of the particular carrier 2 shown in FIG. 6. In this embodiment, the piezoelectric element 1 is held in compression between two molded portions made from casting material 3. Each portion made from casting material 3 abuts both the piezoelectric element 1 and the inside of the opening 9 of the largely ring-shaped, symmetric carrier 2. The opening 9 is further defined by sidewalls 80 that are preferably curved to resiliently absorb the mechanical preload exerted by the casting material 3. This embodiment advantageously uses a pre-formed carrier 2 with the material 3 added to place the piezoelectric element 1 in the desired compression. Alternatively, the entire carrier designated in FIG. 19c as part 2 could be formed of material 3 simultaneously with the parts on opposing ends of the piezoelectric element 1 so the entire carrier 2 is simultaneously formed around the piezoelectric 1. In a preferred variation of the method, the side walls 80 are plastically deformed due to the mechanical load caused by the casting material 3 as the casting material hardens or cures. The onset of plastic deformation in the side walls 80 is a function of the material and geometry of sidewalls 80 and can be used to vary, and if desired to limit the mechanical preload exerted by the casting material 3 on the piezoelectric element 1.

Figure 19D:
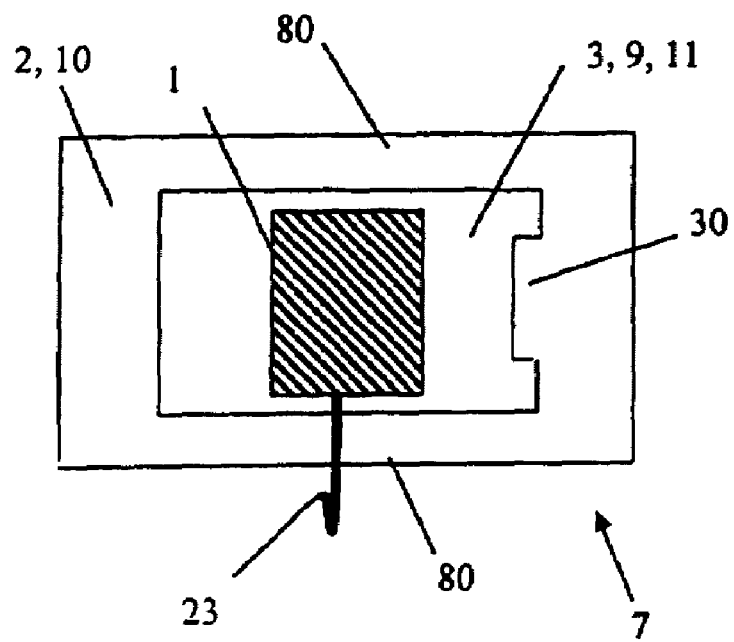

FIG. 19d shows a further preferred, variation of the embodiment of FIG. 19b. In this embodiment, the carrier 2 and a portion of the mold 10 are the same, and therefore the casting material 3 completely fills the opening 9 of the carrier 2, which is also the cavity 11 of the mold 10. The opening 9 is preferably shaped, e.g., by protrusions 30, to channel any compressive forces on the piezoelectric element 1 preferably along the axis of polarization of the piezoelectric element 1. In short, a preformed carrier 2 forms the mold 10 for the material 3 to place the piezoelectric element 1 in compression. The embodiment of FIG. 19d shows a rectangular, six-sided the piezoelectric element 1 being surrounded on four sides (in a plane) by casting material 3, and by carrier 2 (functioning as mold 10). The carrier 2 could enclose only two opposing sides of piezoelectric 1, or it could enclose five sides, or six sides of the piezoelectric element 1.

There is thus provided a piezoelectric device 7 comprising a piezoelectric element 1 that is held in compression within an O-shaped opening 9 of a carrier 2, wherein the opening 9 is in part formed by opposing side walls 80 that are preferably curved and that preferably face opposite sides of the piezoelectric element 1. The opening 9 has preferably an axis of symmetry on which the piezoelectric element 1 is located and that axis is preferably along the axis on which piezoelectric element 1 is compressed.

FIG. 11 shows an embodiment wherein an intrinsic expansive urge of a casting material 3 places a piezoelectric element 1 in compression within a piezoelectric device 7. Here the carrier 2 is advantageously, but optionally, preformed in a letter "H" shape, i.e., comprises two vertical beams 35' and 35" that are connected by a horizontal beam 34. Where the beam 34 connects to the beams 35' and 35", respectively, it is advantageous to have a narrowing portion 33 that provide a locally narrower cross-section of the beam 34 in order to allow the beams 35' and 35" to flexibly pivot about the narrowing portion 33. A narrowing portion 33 sufficiently thin relative to the beams 35', 35" to form a flexure point or a flexure axis is preferred.

As shown in FIG. 11, the carrier 2 now forms a first and a second "C" shaped opening. The first opening holds a piezoelectric element 1 in a clamp-like fashion. Two or more protrusions 30 on the carrier 2 may optionally be used to define the mechanical contact between the carrier 2 and the piezoelectric element 1 by engaging surfaces of the piezoelectric element 1 as shown in FIG. 11, surfaces that are preferably, but optionally, opposing surfaces. The second opening is preferably, but optionally at least partially filled with a molded casting material 3 having an intrinsic expansive urge that by way of the beams 35' and 35" is transformed into a compressive preload onto the piezoelectric element 1. Additional protrusions 31 or indentations or recesses 32 on the carrier 2 may optionally be used to vary the mechanical contact between the carrier 2 and the casting material 3 or to interlock the pre-formed portions of the carrier 2 with the molded portions of the carrier 2. Similar protrusions 31 and indentations or recesses 32 can be used to vary the mechanical contact or interlock between the piezoelectric 1 and the carrier 2, especially for the molded portions of the carrier 2. The protrusions 31 and indentations or recesses 32 can be used with each of the embodiments disclosed herein.

In the embodiment of FIG. 11, the preformed "H" portion of carrier 2 allows the vertical or leg portions 35 of the H shaped section to pivot about the cross-member 34. A piezoelectric element 1 is placed between one pair of distal ends of leg portions 35, and an expansive casting material 3 is placed between the opposing pair of distal ends of leg portions 35. As the casting material 3 expands as it cures or hardens, the piezoelectric 1 is placed in compression. By varying the location of the cross member 34 relative to the length of the vertical or leg members 35, a lever effect can be used to increase or decrease the effect caused by casting material 3.

Figure 16:
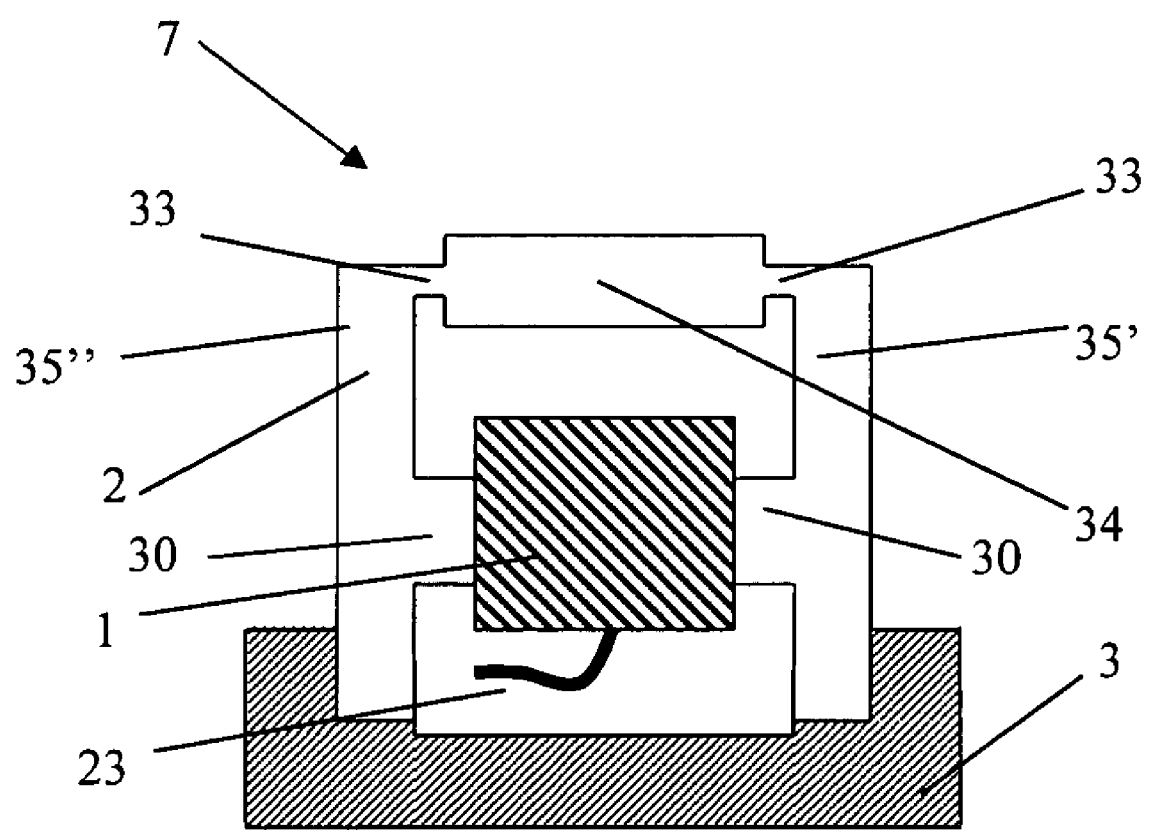
FIG. 16 shows another embodiment of the invention.

FIG. 16 shows a variation of the embodiment shown if FIG. 11 wherein the casting material 3 is selected to have an intrinsic urge to contract during the molding procedure and the casting material 3. The piezoelectric 1 is placed between the two opposing legs or vertical members 35', 35" while one pair of ends of those legs 35', 35' are held a fixed distance apart by a cross-member 34, and the other pair of ends of the legs 35', 35" are urged together by the shrinking or contracting casting material 3. The change in cross-section of the cross-beam or cross-member 34 which is achieved by feature 33, is preferably, but optionally used to form a flexure or pivot point while still maintaining the legs 35, 35" a predetermined distance apart. In this case, the opposing legs 35' 35" are fastened at one end with their distal ends being movable toward each other. The piezoelectric 1 is placed between the opposing legs 35', 35", and the casting material 3 is used to urge the distal ends toward each other.

In the embodiment of FIG. 16, the cross member 34, the piezoelectric 1 and the casting material 3 are generally parallel to each other, and generally perpendicular to the legs 35' and 35". The cross-member 34 acts as the hinge of a nutcracker with the legs 34 acting as the arms of the nutcracker and the piezoelectric element 1 acting as the nut that is placed in compression. The shrinking casting material 3 acts on the ends of the handles of the nutcracker to place the piezoelectric 1 in compression. Protrusions 30 can extend from the members or legs 35', 35," in order to vary the contact with the piezoelectric element 1. The embodiment of FIG. 16 uses the legs 35' and 35" as levers to obtain a mechanical advantage and to multiply the force exerted by the casting material 3 on the piezoelectric element 1 as the casting material 3 changes dimension during curing, cooling, or hardening.

Figure 13:
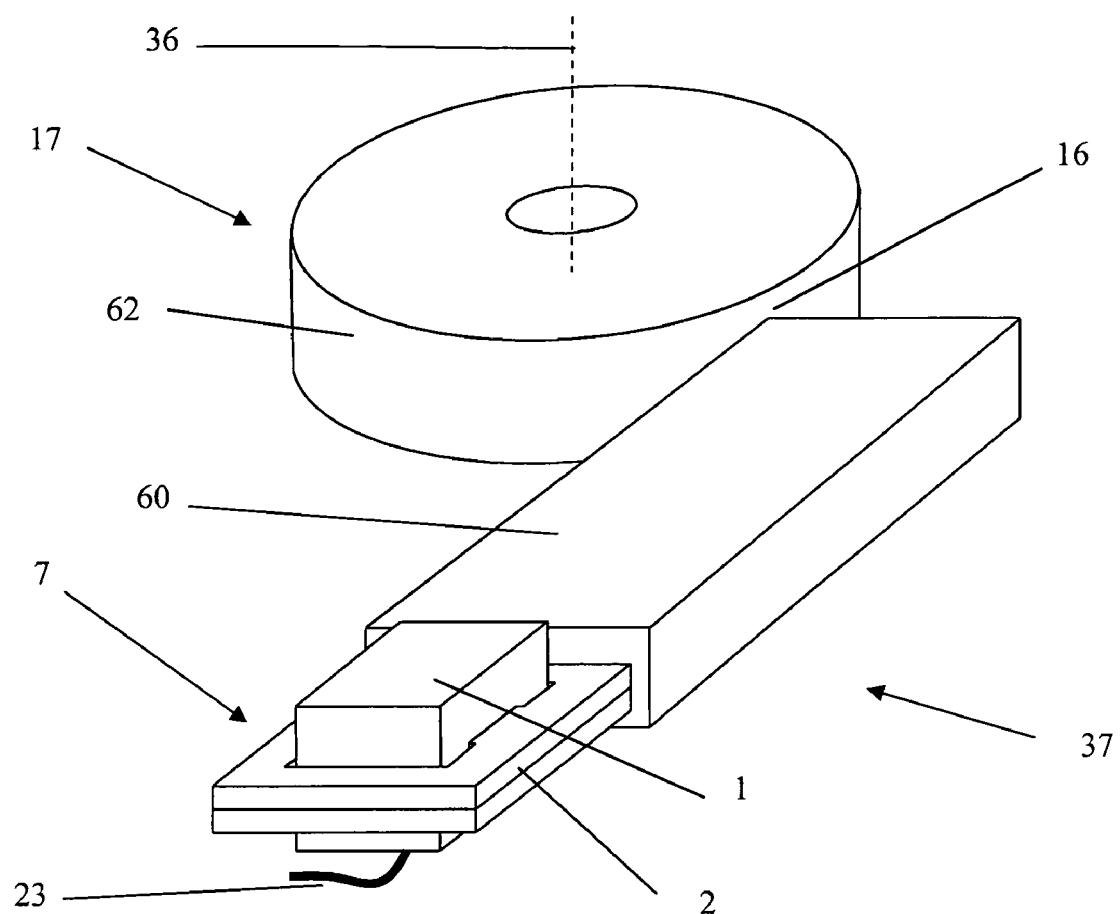
FIG. 13 is a vibratory system for moving a wheel wherein the system comprises a piezoelectric device manufactured according to the invention.

Referring to FIG. 13, any of the vibratory systems 7 disclosed herein can themselves be connected to additional parts to form an enhanced system 37, with the connection to the part typically, but optionally being made after the manufacturing of the vibratory system 7. In this manner a vibratory system 7 becomes a building block comprising a mechanically preloaded piezoelectric element 1 that can be used in applications where such building blocks are used. FIG. 13 shows such a building block in the form of vibratory system 7 placed in driving contact with a part that takes the form of a mechanical resonator 60 to form a vibratory piezoelectric motor 37 that drivingly engages a driven element 17. In this embodiment the driven element 17 takes the form of a wheel 62 rotating about rotation axis 36, with a contacting portion, or mating surface, 16 on the resonator 60 to drive the driven element 17 when an appropriate electric signal is provided to the piezoelectric element 1 through electrical connections 23. Other arrangements and applications using vibratory systems 7 as building blocks can be devised by a person skilled in the art.

A piezoelectric material permanently deforms when electrically polarized and will remain deformed until it is depolarized. This deformation may be used to create a static preload on the piezoelectric element 1 as described in part using FIG. 14.

Figure 14:
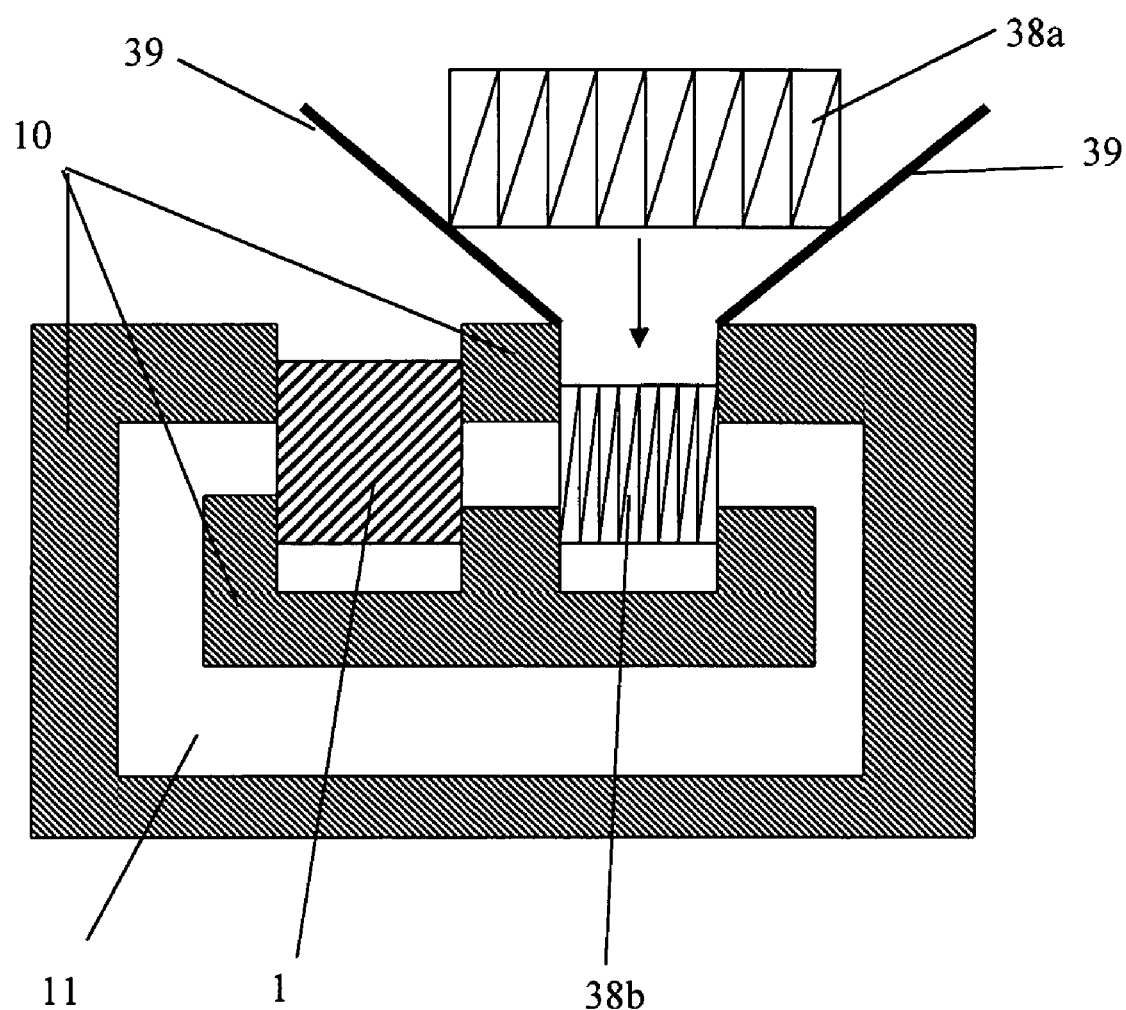
FIG. 14 illustrates a method for manufacturing a piezoelectric device using a mold while concurrently inserting a mechanically preloaded element.

FIG. 14 shows a schematic for a method that uses a flexible insert 38 that has been deformed from its natural state 38a to a compressed state 38b prior to inserting into the mold 10. A spring is one example of insert 38. Chutes or guides 39 can be used, optionally, to help with the inserting into the mold 10 while simultaneously compressing the insert 38. The flexible insert 38 is advantageously, but optionally, shaped to be easily compressed and inserted. Opposing, inclined surfaces converging to an opening through which the compressed insert 38 can pass, comprise one example of the guides 39. The cavity 11 is then filled with the casting material 3 and the mold 10 is removed so the casting material 3 holds the piezoelectric element 1 and the insert 38. After molding, the flexible member 38 retains an intrinsic urge to expand from its compressed state 38b. If the insert 38 expands against a wall or member which abuts the piezoelectric element 1, the insert 38 will exert a compressive preload onto the piezoelectric element 1. Thus upon removal of the mold 10, the flexible member 38 tends to expand, exerting a force on the molded and hardened casting material 3 that now forms a hardened carrier 2, so as to place the piezoelectric element 1 in compression. The insert 38 spreads the distal ends of the C shaped or U shaped carrier 2 apart with the carrier 2 acting as a spring to resist the force of the insert 38. The piezoelectric element 1 is compressed between the spring force of the carrier 2 and the intrinsic, expansive force of the insert 38.

FIG. 15a and FIG. 15b show, respectively, a variation of the method and apparatus illustrated in FIG. 14, comprising a flexible clamp-like member 38 that is slipped over appropriately placed openings in the mold 10 so that the legs of the clamp 38 are urged apart during molding either by the mold 10 or the casting material 3 escaping through the openings. After molding, the clamp retains an urge that places the piezoelectric element 1 in compression.

In more detail, the portions of the mold 10 hold opposing sides of the piezoelectric element 1, with a space or channel 11 being formed between the molds. The space or channel 11 fills with the casting material 3 which hardens or cures, after which the mold 10 is removed. During molding, the casting material 3 abuts contacting portions of the piezoelectric element 1, preferably on opposing sides of the piezoelectric element 1, and the casting material 3 extends to an exterior portion of the mold accessible to the clamp member 38. The clamp-like member 38 is shown as a U-shaped member having opposing legs 64 with distal ends located to resiliently abut the casting material 3 that extends to the exterior of the mold 10 and exert a compressive force on that material. When the mold 10 is removed, the clamp 38 squeezes the carrier 2 formed by the hardened casting material 3, placing the piezoelectric element 1 in compression.

Various shapes of the clamp member 38 can be used to accommodate various shapes of the mold 10 and various locations of the accessible casting material 3. The legs 64 of the clamp member 38 are spread apart in order to place the clamp 38 over the mold 10, and that causes the legs 38 to resiliently urge the distal ends of the legs toward each other and exert the compressive force on the casting material 3 and the piezoelectric element 1. The clamp member 38 can be placed over the mold 10 before the casting material 3 is inserted, or after. Conceptually, the piezoelectric element 1 has two contacting portions on two opposing surfaces of the piezoelectric element formed by casting material 3 and mold 10, with the clamp member 38 contacting the casting material 3 on opposing sides of the piezoelectric element 1 to place the piezoelectric element in compression. The clamp 38 and the casting material 3 can be varied to vary the amount of compression on piezoelectric element 1.

FIG. 15c shows a preferred variation of the embodiment of FIG. 15b, wherein the clamp member 38 is a symmetric, ring-shaped clamp rather than a U-shaped clamp. In this embodiment, the axis of piezoelectric element 1 compression is also an axis of symmetry of the piezoelectric device 7 so that the piezoelectric element 1 is not exposed to any substantial (and preferably no) shear or bending forces, i.e., the piezoelectric element 1 experiences symmetric loading conditions. Note, however, that with proper dimensioning of all interacting members of the piezoelectric device 7, symmetric loading conditions can also be achieved in a geometrically non-symmetric configuration.

Figure 17A:
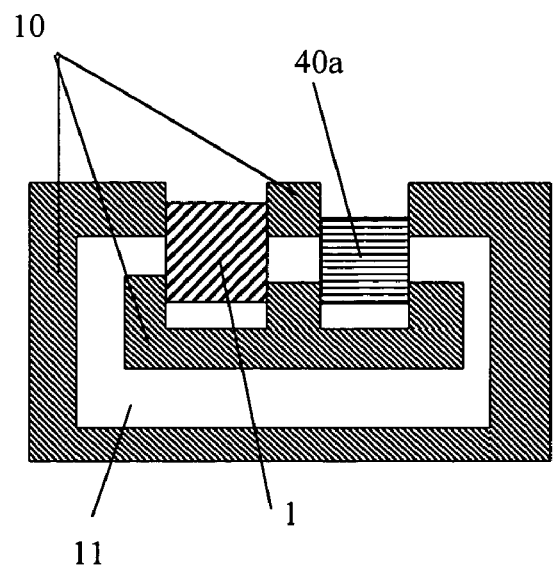
FIGS. 17a–17c illustrate a method for assembling a piezoelectric device by plastically deforming an insert.
Figure 17B:
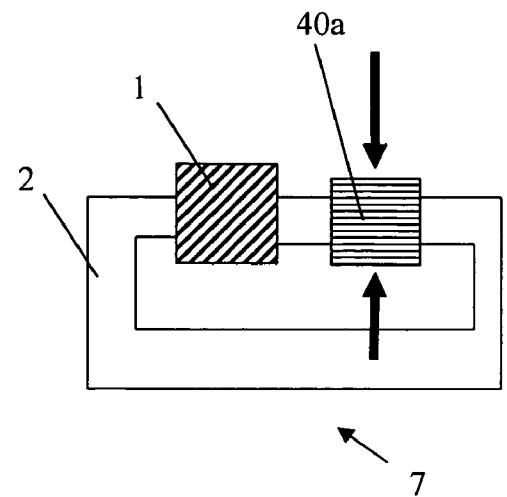
Figure 17C:
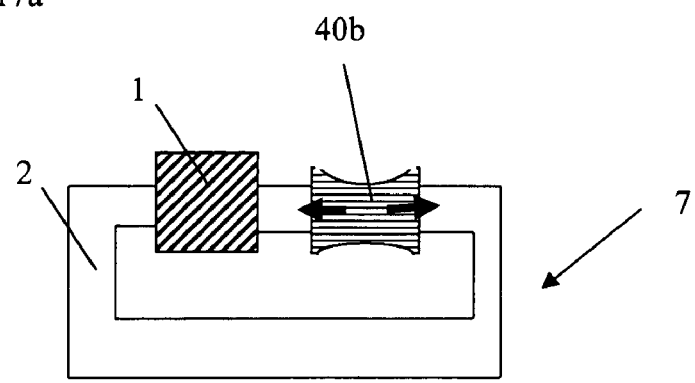

FIGS. 17a–17c show a variation of the method and apparatus illustrated in FIG. 14. Here a deformable insert 40a is molded concurrently with the casting material 3 and is then laterally compressed, e.g., along the indicated vertical arrows, to create a permanently, deformed insert 40b, which causes a force along the indicated horizontal arrows onto the carrier 2, which then exerts a compressive force onto the piezoelectric element 1. In more detail and referring to FIG. 17A, the mold 10 defines channels 11 which form the carrier 2 after the casting material 3 encases the piezoelectric element 1 and deformable insert 40a and after the casting material 3 hardens and the portions of mold 10 are removed. From the mold 10, the carrier 2 of FIG. 17B is un-molded. While the carrier 2 is shown generally having a ring shape other shapes can be used. Subsequent deformation of the insert 40a into 40b causes the piezoelectric 1 to be placed in compression as reflected in FIG. 17C. Deformable inserts 40a may comprise a shape memory alloy that is deformed preliminary to assembly of the piezoelectric device 7 under conditions known to a person skilled in the art and then, after assembly, is heat treated or exposed to an electric current in order to cause the shape memory alloy to change its shape back into its previous memorized shape in a predetermined manner and, in the process, to cause a lasting preload on the piezoelectric element 1.

Figure 17D:
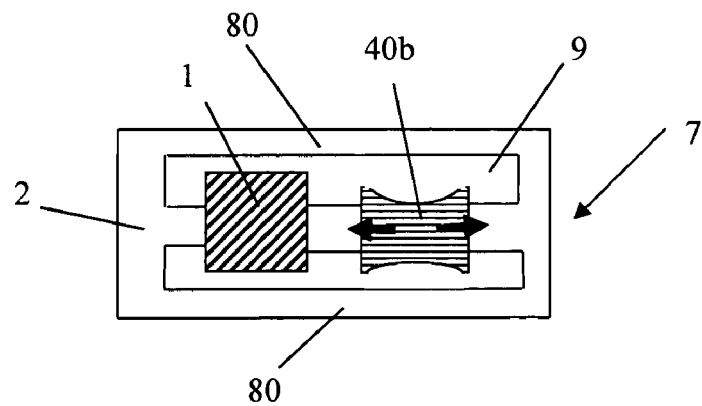
FIG. 17d is a variation of the embodiment of the piezoelectric device shown in FIG. 17c.

FIG. 17D is a preferred variation of the piezoelectric device 7 shown in the embodiment of FIG. 17C. In this embodiment the carrier 2 has the general shape of a ring and the piezoelectric element 1 and deformable insert 40b are coaxially located on an axis of symmetry of the ring shaped carrier 2. The opening 9 on either side of the piezoelectric element 1 is formed by straight, or preferably curved, sidewalls 80. The symmetric configuration has the advantage that the piezoelectric element 1 can be placed in compression along its axis of polarization without exerting static shear or bending forces on the piezoelectric element 1 that are due to non-symmetric aspects of the carrier 2. In this embodiment the carrier 2 forms outer walls 80 each of which is on an opposing side of a central wall that holds the piezoelectric element 1 and the deformable insert 40b. The side walls 80 resist movement caused by the deformation of deformable element 40b, to provide a symmetric mount to hold the piezoelectric element 1 in compression.

There is thus advantageously provided a vibratory device 7 having a piezoelectric element 1 held in sufficient static compression to maintain the piezoelectric element in compression during normal use of the vibratory device. The device 7 includes a carrier 2 holding the piezoelectric element 1 where the carrier is formed at least in part from the casting material 3. In this embodiment, the casting material advantageously, but optionally, changes from a softer state to a harder state over a short period of time to place the piezoelectric element in compression. The device also includes a mechanically deformable insert 40 at least partially held by the casting material 3, wherein the deformable insert is configured to change dimension upon a predetermined deformation, with the change of dimension selected to cause a majority of the static compression on the piezoelectric element. In further variation, the deformation of the insert 40 is selected to comprise about 90% or more of the static preload.

In a further variation the piezoelectric device 7 includes a deformable insert 40 and a carrier 2 formed of casting material 3 that changes dimension as the material hardens from a softer state to a harder state. The carrier 2 holds the deformable insert 40 and the piezoelectric element 1, wherein the deformable element is deformed after the carrier is formed in order to cause a majority of the static preload.

There is also advantageously provided a method of making a vibration device 7. The method includes providing a deformable insert 40 selected to cause a predetermined change in dimension when deformed, and forming a carrier at least partially from a casting material 3 to hold the piezoelectric element 1 and the deformable insert 40. The casting material goes from a softer state to a harder state. In this deformable embodiment, the casting material 3 also preferably, but optionally, undergoes a change in dimension during formation of the carrier 2 to exert a compressive force on the piezoelectric element 1. After formation of the carrier 2, the insert 40 is deformed, with the deformation placing the piezoelectric element 1 in static compression sufficient to maintain the piezoelectric element in compression during normal use of the vibratory device. While the deformable insert 40 could provide anywhere from a small portion of the preload to the entire preload, the deformation preferably provides a majority of the static preload. Preferably the deformation provides about 90% or more of the static preload.

In a further embodiment the vibration comprises a piezoelectric element 1 and a carrier 2 holding the piezoelectric element in a predetermined compression sufficient to maintain the piezoelectric element in compression during use of the vibratory system. The carrier 2 is formed at least in part from a casting material 3 that changes from a softer state to a harder state over a short period of time. A mechanically deformable insert 40 is at least partially embedded in the casting material, with the deformable insert changing dimension to cause a majority of the static preload on the piezoelectric element.

The deformable insert 40 advantageously, but optionally comprises a mechanically compressed resilient member having opposing ends abutting and held in compression by the casting material 3. Advantageously, but optionally, a statically preloaded element 1 can be provided by a clamp-type device 38 cooperating with the casting material 3. The piezoelectric element 1 advantageously has an axis of polarization and the deformable insert 40 preferably, but optionally causes a compressive force on the piezoelectric element along that axis. This is preferably achieved by locating the deformable insert 40 on the axis of polarization. Preferably deformable insert 40 is deformed after the casting material hardens. The deformation is advantageously irreversible. A plastic deformation is desired for those materials having a plastic deformation limit.

The deformable insert 40 advantageously, but optionally can include a shape memory alloy. In some embodiments it is advantageous for the casting material 3 to completely encase the deformable insert 40, whereas in other embodiments the deformable insert 40 is only partially enclosed, or merely abuts the casting material 3. Advantageously the casting material 3 is shaped inside a mold 10 to achieve the desired contact or encasement of the piezoelectric element 1 and insert 40. These variations and embodiments apply to the other versions of the piezoelectric device 7 which use the insert 40.

There is also provided a method of making a vibration device 7 having a piezoelectric element that uses the deformable insert to achieve the preload. The method includes providing a deformable insert 40 selected to cause a predetermined change in dimension when deformed. A carrier 2 is formed from a casting material 3 to hold the piezoelectric element 1 and the deformable insert 40, with the casting material 3 going from a softer state to a harder state. In this insert embodiment the casting material 3 preferably, but optionally undergoes a change in dimension during formation of the carrier 2 to exert a compressive force on the piezoelectric element 1. The method also includes deforming the insert 40, after formation of the carrier 2, so that the deformation places the piezoelectric element 1 in static compression sufficient to maintain the piezoelectric element 1 in compression during normal use of the vibratory device 7. The deforming step can provide a small portion, or the entire desired preload. But advantageously the deformation provides a majority of the static preload, and preferably the deformation provides about 90% or more of the static preload.

In another embodiment the method includes molding the casting material 3 to connect the piezoelectric element 1 and the deformable insert 40 while permanently placing the piezoelectric element 1 in static compression due to a change of dimension of the deformable insert 40. Advantageously, but optionally, either method using the insert deformable insert 40 is a statically preloaded element whose static preload causes the static compression of the piezoelectric element 1. Preferably the statically preloaded element is a clamp-type device 38. The method advantageously includes irreversibly deforming the deformable insert 40 after hardening of the casting material 3. This includes plastically deforming material that have an elastic limit. In further variations, the deformable insert 40 can a shape memory alloy. Moreover, the method can include the deforming the shape memory alloy before molding the casting material 3 and then returning the shape memory alloy to its memorized state after the casting material 3 hardens.

The deformable inert 40 and its various uses and embodiments discussed herein comprise deformable means for exerting or causing some or all of a static preload on the piezoelectric element 1, and preferably cause about half the preload, and more preferably cause about 90% or more of the preload. This preload is the static preload to maintain the piezoelectric element in compression during normal use of the vibratory device, There is thus provided a piezoelectric device 7 that comprises a piezoelectric element 1 being held in static compression by a carrier 2 so that the compressive force to hold the piezoelectric element 1 in compression is generated by a metallic, polymeric, or other encasing compound 3 that develops an intrinsic urge to expand, contract, or deform otherwise, e.g., due to shrinkage, during molding of the carrier 2 or portions thereof from the encasing compound 3. The piezoelectric element 1 is advantageously compressed along its axis of electric polarization.

In a preferred embodiment only the compound or casting material 3 is in direct mechanical contact with the piezoelectric element 1 with the exception of electrical connections 23 to the piezoelectric element. The encasing compound 3 may completely encase the piezoelectric element 1, but need not do so.

In a further embodiment, the compound or casting material 3 comprises a mechanically pre-stressed element and/or the static compression is caused by the electric polarization of the piezoelectric element 1. Furthermore, the encasing compound 3 may be electrically conductive.

In a preferred embodiment, the carrier 2 has a selected contacting portion, or mating surface, 16 located to engage a driven element 17 during use of the system—or the carrier is connected to a part having such a contacting portion 16—to serve as a piezoelectric vibratory motor, wherein the selected contacting portion 16 and the piezoelectric element 1 are continuously connected by the encasing compound 3. The compound or casting material 3 may also form a fastening feature 4 such as resilient element for mounting the vibratory system to a base and for resiliently urging the selected contacting portion 16 against the driven element 17 during use of the system.

In a preferred embodiment, the carrier 2 comprises additional inserts 18, 26, 38, 40, or other, that are continuously connected to the piezoelectric element 1 by the encasing compound 3 and provide additional functionality.

There is further provided a method for producing a vibratory system comprising a piezoelectric element 1, a carrier 2 to hold the piezoelectric element in compression and a metallic, polymeric thermoset, polymeric duropolast, ceramic, or other moldable encasing compound 3 with an intrinsic urge to cause the compressive force to hold the piezoelectric element 1 in compression. The method advantageously comprises molding the encasing compound 3 while simultaneously connecting it to the carrier 2 and the piezoelectric element 1 and while allowing the compound to develop an intrinsic urge, e.g., due to shrinkage, during the hardening or curing phase of the molding in order to place the piezoelectric element 1 in static compression. The encasing compound 3 may be allowed to contact only a portion of the piezoelectric element 1, or it may encase the piezoelectric element 1, or combinations thereof. The compound my be a composite casting material 3 comprising filler materials such as glass fibers, glass spheres, carbon fibers, carbon powder, minerals, or other.

In a preferred variation of the method, the entire carrier 2 itself is molded from the encasing compound 3 while being connected to the piezoelectric element 1. In a further preferred variation of the method, the encasing compound 3 is molded under pressure and at least a portion of that pressure is maintained after molding to create an intrinsic expansive urge in the encasing compound 3. The compound may simultaneously form a fastening feature 4 such as a resilient element for mounting the vibration device during molding.

In another preferred variation of the method, the piezoelectric element 1 is held in place during molding by electrical connections 23 or conductive pins 70, etc. to the piezoelectric element 1 through which an electrical signal may be applied during the manufacture of the system. The encasing compound 3 is preferably selected to maximize the transmission of mechanical vibrations from the piezoelectric element 1 into the carrier 2 when the piezoelectric element 1 is excited with a vibratory electric signal. It is possible to cause the static preload on the piezoelectric element 1 by electrically polarizing the piezoelectric element 1.

There is further provided a method for producing a vibratory device 7 comprising a piezoelectric element 1 and inserts 38 or 40, wherein the method comprises molding a moldable encasing compound 3 to connect the piezoelectric element 1 to the insert 38, 40, in a manner that permanently places the piezoelectric element 1 in static compression during manufacture of the device 7. The insert 38 is preferably a statically preloaded element, e.g., a clamp type device, whose static preload causes the static compression of the piezoelectric element 1, while the insert 40 is a deformable insert which changes shape so as to place the piezoelectric element 1 in compression.

In a preferred variation of the method, the insert 38, 40 is plastically deformed after completion of the mold to cause the static preload on the piezoelectric element 1. There is thus advantageously provided a vibratory system having a piezoelectric element 1 with an axis of polarization. A carrier 2 abuts at least one side of the piezoelectric element 1 and holds the piezoelectric element 1 in a predetermined compression. The compression is advantageously, but optionally sufficient to maintain the piezoelectric element 1 in compression during use of the system. The carrier 2 is formed in part from a casting material 3 that changes from a softer state to a harder state over a short period of time and that also changes dimension as the casting material 3 achieves the harder state. The change in dimension of the casting material 3 places the piezoelectric element 1 in the desired compression, which is advantageously sufficient compression to operate the piezoelectric element 1.

The short period of time is typically minutes rather than hours, and almost never measured in days. The short period of time corresponds to the time it takes for a liquid metal casting material 3 to cool and harden and that time is usually minutes as the devices 7 are typically small. It also corresponds to the time it takes for a polymer casting material 3 to cure and harden, or the time it takes for a compressed powdered casting material 3 to cool and harden. In each of these, the forming or molding process or curing process could be varied or delayed if needed to allow the casting material 3 to harden properly without cracking or other forming defects in the carrier 2. But the time is still relatively short, preferably measured in minutes. The short hardening time advantageously increases the number of parts that can be manufactured per hour. By making the devices 7 small, the time to form and harden the carrier 2 is also reduced.

The casting material 3 advantageously abuts and bonds to at least one side of the piezoelectric element 1, and preferably abuts and bonds to two opposing sides of the piezoelectric element 1, and more preferably the sides are located on the axis of polarization so the compression is along the polarization axis. The bond is the type of bond formed when the piezoelectric element 1 is cast or molded in situ with the casting material 3, and will vary with the nature of the casting material 3 and the process used to form the carrier 2 from casting material 3. The change in dimension of the casting material 3 preferably arises from shrinkage of the casting material 3, but the mold 10 defining the shape of the carrier 2 could be arranged so the expansion of the casting material 3 places the piezoelectric element 1 in compression. The casting material 3 could be an electrically conductive material, and preferably comprises a polymeric compound having at least one of glass fibers, glass spheres, carbon fibers, carbon powder, or minerals as a filler material.

In further variations of the method and apparatus, an insert is formed in situ in the carrier 2 to place the piezoelectric element 1 in compression. The insert can take the form of a mechanically pre-stressed element 38 such as a spring, which is connected to the carrier 2 and exerts a compressive force on the piezoelectric element 1. The insert can also take the form of a deformable insert 40 which after formation of the carrier 2, is deformed to exert a compressive force on the piezoelectric element 1.

Advantageously the carrier 2 has a selected contacting portion, or mating surface, 16 located to engage a driven element 17 during use of a vibratory system, the selected contacting portion 16 and the piezoelectric element 1 being at least partially embedded in the casting material 3. Advantageously the casting material 3 also forms a fastening feature 4 or fastens to a fastening insert 18 for mounting the vibratory device 7 to a base and preferably, but optionally, also for resiliently urging the selected contacting portion 16 against the driven element 17 during use of the system. Depending on the casting material 3, the fastening feature 4 can be formed of the casting material 3, or as desired, the fastening insert 18 can be formed of something else and partially embedded in the casting material 3 as it hardens to form the carrier 2. The carrier 2 can also have a resonator or a mating insert 26 at least partially embedded in the casting material 3 that hardens to form the carrier 2. In a further variation, the casting material 3 suspends the piezoelectric element 1 on bridges 24 (FIG. 8) formed of the casting material 3 and extending outward from the piezoelectric element 1.

The carrier 2 can take many shapes, with C shaped frames being suitable so the formed casting material 3 holds the piezoelectric element 1 against at least one distal end of the C shaped frame. In one variation, the piezoelectric element 1 is held in a C shaped frame with the encasing material located between each of two opposing distal ends of the C shaped frame and the piezoelectric element 1. When the piezoelectric element 1 and casting material 3 are added, these C shaped frames or completed carriers 2 typically form a ring type structure. But a variety of shapes are suitable. In another variation the piezoelectric element 1 is held in an H-shaped frame 2 having two opposing legs 35 and a connecting member 34, with the casting material 3 and piezoelectric element 1 located between the legs 35 and on opposing sides of the connecting member 34 so that a change in dimension of the casting material 3 causes the frame 2 to alter the stress on the piezoelectric element 1. In a still further variation, the piezoelectric element 1 is held in a frame 2 having two opposing legs 35 and a connecting member 34 extending between the legs 35, with the casting material 3 and piezoelectric element 1 located between the legs 35 and on the same side of the connecting member 34 so that a change in dimension of the casting material 3 causes the frame 2 to alter the stress on the piezoelectric element 1.

In a further embodiment there is advantageously provided a piezoelectric element 1 having an electrical connection 23 extending therefrom, the piezoelectric element 1 having opposing sides held by a carrier 2 formed at least in part from a casting material 3 which hardens and changes dimension during the hardening to place the piezoelectric element 1 in compression sufficient to offset a substantial portion of the expansion stresses on the piezoelectric element 1 during use of the piezoelectric element 1.

There is also advantageously provided a method for manufacturing a piezoelectric vibration device 7 in which the piezoelectric element 1 is held in compression by a carrier 2. The method includes forming a part of the carrier 2 from a casting material 3 that changes dimensions as it hardens and using a sufficient amount of the casting material 3 to achieve a desired dimensional change of the casting material 3. The casting material 3 is located in the carrier 2 so that the change in dimension of the casting material 3 places the piezoelectric element 1 in the desired compression. As the casting material 3 hardens with the piezoelectric element 1 in the carrier 2, the casting material 3 changes dimension and exerts a predetermined compression on the piezoelectric element 1. The predetermined compression is advantageously, but optionally, sufficient to maintain the piezoelectric element 1 in compression during normal operation. In further embodiments, additional means are provided to further compress the piezoelectric element 1. The casting material 3 is preferably selected to shrink during hardening.

The encasing material is advantageously, but optionally, molded or cast under pressure by restraining expansion of the casting material 3 by the carrier 2. Advantageously the carrier 2 holds the casting material 3 and the casting material 3 contacts only a portion of the piezoelectric element 1. In a further embodiment, the casting material 3 encases the entire piezoelectric element 1. The process also includes embedding a fastening insert 18 such as a resilient mounting element in the encasing material, and/or embedding a portion of a resonator or a mating insert 26 in the casting material 3. The process advantageously includes forming the entire carrier 2 from the casting material 3. In a further variation of the process, the piezoelectric element 1 is held in place during molding by electrical connections 23 to the piezoelectric element, and/or electrically conductive pins 70 that are used after the casting material 3 hardens to form the electrical connections to the piezoelectric element 1.

The process also advantageously includes using the electrical signal to cause the piezoelectric element 1 to remain in a contracted or expanded configuration for a prolonged period of time when the casting material 3 is hardening. The prolonged period of time corresponds to an amount sufficient to allow the casting material 3 to harden and maintain a desired preload, which is measured in seconds or minutes compared to the fractions of a second during which the piezoelectric element 1 normally changes dimension. In further variations of the process, a static preload is applied on the piezoelectric element 1 by electrically polarizing the piezoelectric element 1 after the piezoelectric element is held by the hardened casting material 3. In further variations of the process, the piezoelectric element 1 can vibrate while the casting material 3 changes dimension.

The casting material 3 used in the process can comprise an injection moldable polymeric compound, and preferably includes a thermoset or duropolast polymer. The polymeric compound advantageously comprises at least one of (glass fibers, glass spheres, carbon fibers, carbon powder, minerals) as a filler material. The method also advantageously includes selecting the casting material 3 to maximize the transmission of mechanical vibrations from the piezoelectric element 1 into the carrier 2 when the piezoelectric element 1 is excited with a vibratory electric signal.

There is also advantageously disclosed a method for manufacturing a piezoelectric vibration 7 device having a piezoelectric element 1 and an insert 38, 40, which includes molding a casting material 3 to connect the piezoelectric element 1 and the insert 38, 40 while permanently placing the piezoelectric element 1 in static compression as the casting material 3 hardens. This method also includes using a statically preloaded element 38 whose static preload causes the static compression of the piezoelectric element 1. Advantageously the statically preloaded element 38 is a resilient, clamp-type device, but could be an expansion type device such as a compressed spring. The method could also include the step of plastically deforming the insert 40 after hardening of the casting material 3 to cause a further static preload on the piezoelectric element 1.

The change in dimension of the casting material 3 provides a means for placing the piezoelectric element 1 in compression. The portions of the mold 10 provide means for forming the casting material 3 into the desired shape of the carrier 2. For suitable casting materials 3 it may not be necessary to use a mold 10 to hold the casting material in a predetermined form while the casting material hardens and changes dimension. The openings 12, 13 and 19, 20 provide means for defining the location of the contact between the casting material 3 and the piezoelectric 1. If desired, the area with which the casting material 3 contacts the piezoelectric element 1 can be controlled during molding, or shaped after molding, to precisely define the area of contact and/or the shape of the area between the material 3 and the piezoelectric element 1.

In a further embodiment, the static compression on the piezoelectric element 1 is caused entirely or at least in part by polarizing the piezoelectric element 1 after the piezoelectric element 1 is held by the hardened casting material 3. The effect occurs due to the polarization-induced expansion of the piezoelectric element 1 and can be used in the other piezoelectric device 7 configurations disclosed herein as well to cause or enhance the preload on the piezoelectric element 1. During polarization the piezoelectric element 1 expands, primarily along its axis of polarization. Much of that expansion is permanent, and thus offers the further preload advantages suitable for use either alone or in combination with the various embodiments and methods disclosed herein.

In another embodiment thermal changes are used to induce the static preload. But there are difficulties using thermal changes with piezoelectric elements 1. The piezoelectric element 1 is typically a ceramic, and brittle. The piezoelectric elements 1 typically are good thermal insulators and poor conductors, which when combined with the brittle ceramic material makes them more subject o breaking under thermal shock. Cooling ceramics usually makes them more brittle. Thermal changes can depolarize the piezoelectric, and can cause the generation of electric charges that complicate handling and forming the piezoelectric device 7. The piezoelectric elements 1 are often stacked elements of metal conductors and piezoelectric ceramic discs, using materials that expand at different rates. Applying substantial thermal changes to these stacks of metals and ceramics causes movement that can affect electrical connections and the integrity and functioning of the piezoelectric element 1. Thus, while thermally based shrink fitting of parts has been used in some areas, it is not believed to be used in generating the static preload for piezoelectric devices.

There is thus advantageously provided a thermal based method for manufacturing a vibration device 7 having a piezoelectric element 1 held in sufficient static compression to maintain the piezoelectric element 1 in compression during normal use of the vibratory device 7. The method includes applying a temperature difference between the piezoelectric element 1 and at least a portion of the carrier 2 which temperature difference is sufficient to allow the piezoelectric element 1 to be inserted into an opening 9 in the carrier 2. In some instances it may be useful to additionally pull apart the opening 9 while the piezoelectric element 1 is being inserted into the opening 9 so that the distance between opposing opening 9 end walls abutting the piezoelectric element 1 is increased. Then, when the carrier 2 with the piezoelectric 1 therein is brought to an operational temperature of the piezoelectric device 7, the change in temperature causes additional compression on the piezoelectric element 1. Advantageously at least half the static preload is caused by this thermal differential, and preferably about 90% or more is caused by this temperature differential, and ideally all the static preload arises from the thermal differential. Advantageously the applied temperature differential allows the piezoelectric element 1 to be inserted into the opening 9 without elastically deforming the opening, but the carrier 2 and/or piezoelectric 1 could be brought to the desired temperature differential and then press-fit together using suitable measures to accommodate the temperatures of the parts and any resulting difficulties in handling the parts.

The temperature differentials required will vary with the design of the carrier 2 and the materials used. Some materials can be heated more than others and have larger thermal expansion coefficients than others. The expansion coefficient of polymers can be several times the thermal expansion coefficient of metals. But metals are stiffer than polymers, so small changes in dimension can cause larger forces, reducing the need for larger thermal differentials. Some materials, such as heat treated metals, may undergo property changes at certain temperatures, and it is desirable to avoid such temperature induced property changes unless the step of applying a temperature difference between the piezoelectric 1 and at least a portion of the carrier 2 is an integral step of the heat treatment of the material. Some materials, like metals, can be cooled more than others, like polymers, and do not degrade or become brittle when cooled several hundred degrees. Some materials, like polymers, are more susceptible to thermal shock than others, especially due to brittleness and due to crack formation within inhomogeneous materials.

The design of the piezoelectric element 1 also affect the temperature differential as longer piezoelectric elements 1 are more compressible, while smaller cross section piezoelectric elements 1 make it easier to apply the desired preload stress. Given the above, it is believed that temperature differentials of about 150° C. or more may be suitable for smaller piezoelectric elements 1 within metal carriers 2. But, temperature differentials of several hundred degrees are desirable, such as 300–500° C. Even higher temperatures of about 600° C. to 800° C. are ideal, but may require special materials and special handling.

For those designs that use heating, the method thus includes heating at least a portion of the carrier 2 or piezoelectric element 1 to create a temperature differential of over 150° C., and then cooling the carrier 2 to an operational temperature of the piezoelectric device 7. For those designs that use cooling, the method thus includes cooling at least a portion of the carrier 2 or piezoelectric element 1 to create a temperature differential of over 150° C., and then allowing the temperature of the mated or assembled parts to rise to the operational temperature of the piezoelectric device 7. In both cases the above discussed parameters and design considerations apply and the several variations discussed herein can be used.

These variations include heating one part and cooling the other part before inserting the piezoelectric element 1 into the opening 9 in the carrier 2. Further, the carrier 2 can have curved side walls 80 defining the opening 9 for the piezoelectric element 1, and the walls alone can be heated. Alternatively, the entire carrier 2 and/or piezoelectric 1 could be heated before assembly. Means for heating include ovens, open flames, chemical reactions, radiant heat, contact heat transfer, electric inductive and/or resistive heat generation, and heat generation by causing dissipative mechanical vibrations of the piezoelectric element 1.

The thermal differentials applied to piezoelectric 1 and/or carrier 2, and the various thermal differential uses and thermal differential embodiments discussed herein comprise thermal differential means for exerting or causing some or all of a static preload on the piezoelectric element 1, and preferably cause about half the preload, and more preferably cause about 90% or more of the preload. This preload is the static preload to maintain the piezoelectric element 1 in compression during normal use of the vibratory device.

Further design parameters for choosing an appropriate temperature differential are the expected temperature range of the application for which the piezoelectric device 7 is designed for, the expected heat exchange that will take place between the piezoelectric element 1 and the rest of the piezoelectric device 7, the expected heat exchange that will take place between the piezoelectric device 7 and the environment, and the heat production of the piezoelectric element 1 when it is being electrically excited. A thermal based method for manufacturing a vibration device 7 having a piezoelectric element 1 held in sufficient static compression to maintain the piezoelectric element 1 in compression during normal use of the vibratory device 7 thus advantageously comprises selecting a temperature differential during manufacture of the piezoelectric device 7 to cause a static preload on the piezoelectric element 1 so that the static preload does not exceed predetermined upper an lower bounds under operational thermal conditions of the piezoelectric device 7. Preventing the static preload from exceeding the lower bounds prevents tensile stresses onto the piezoelectric element 1, while preventing the static preload from exceeding the upper bounds prevents excessive compressive forces that can damage the piezoelectric element 1, the carrier 2, or any other portion of the piezoelectric device 7, or that can adversely alter preload-dependent material properties of the piezoelectric element 1.

In a very narrowly defined thermal environment, e.g., in one where the temperature is held constant, temperature differentials of less than 150° C. may be sufficient during the manufacture of the piezoelectric device 7. Also, if the piezoelectric device 7 is designed to have the piezoelectric element 1 and the carrier 2 opening 9 change mating dimensions by equal amounts when the entire piezoelectric device 7 undergoes a uniform temperature change within the expected operational temperature range of the device 7, then temperature differentials of less than 150° C. may be sufficient during the manufacture of the piezoelectric device 7.

The above description is given by way of example, and not limitation. Given the above disclosure, one skilled in the art could devise variations that are within the scope and spirit of the invention. The various features of this invention can be used alone, or in varying combinations with each other and are not intended to be limited to the specific combination described herein. Thus, the invention is not to be limited by the illustrated embodiments but is to be defined by the following claims when read in the broadest reasonable manner to preserve the validity of the claims.

What is claimed is:

1. A method for manufacturing a piezoelectric vibration device having a piezoelectric element held in compression by a carrier, comprising:
    forming a part of the carrier from a casting material that changes dimensions as it hardens and using a sufficient amount of the casting material to achieve a desired dimensional change of the casting material;
    locating the casting material in the carrier so that the change in dimension of the casting material places the piezoelectric element in compression; and
    hardening the casting material with the piezoelectric element in the carrier so the casting material changes dimension and exerts a predetermined compression on the piezoelectric element.

2. The method of claim 1, wherein the casting material is selected to shrink during hardening.

3. The method of claim 1 wherein the casting material is shaped inside a mold.

4. The method of claim 1, wherein the hardening step includes curing the casting material.

5. The method of claim 1, wherein the hardening step includes the step of cooling a metallic casting material.

6. The method of claim 1, wherein the predetermined compression is more than 15% of the total compression on the piezoelectric element.

7. The method of claim 1, wherein the predetermined compression is a majority of the compression arising during normal operating parameters of the vibratory system.

8. The method of claim 1, further comprising molding the casting material under pressure and restraining expansion of the casting material by the carrier.

9. The method of claim 1, wherein the carrier includes a partially pre-formed carrier that holds the casting material.

10. The method of claim 1, wherein the casting material encases the entire piezoelectric element with the exception of electrical connections to the piezoelectric element.

11. The method of claim 1, further comprising embedding a resilient mounting element in the casting material.

12. The method of claim 1, further comprising forming a resilient mounting element of the casting material.

13. The method of claim 1, further comprising embedding a portion of a resonator in the casting material.

14. The method of claim 1, further comprising forming the entire carrier of the casting material.

15. The method of claim 1, further comprising holding the piezoelectric element in place during the hardening of the casting material by electrical connections to the piezoelectric element.

16. The method of claim 1, further comprising providing an electrical signal to the piezoelectric element through electrical connections to the piezoelectric element during the hardening of the casting material.

17. The method of claim 16, wherein the electrical signal causes the piezoelectric element to remain in a contracted configuration for a prolonged period of time when the casting material is hardening.

18. The method of claim 1, wherein the casting material is an injection moldable polymeric compound.

19. The method of claim 18, wherein the polymeric compound includes a thermoset or duropolast polymer.

20. The method of claim 1, wherein the casting material is a ceramic compound.

21. The method of claim 18, wherein the polymeric compound comprises at least one of (glass fibers, glass spheres, carbon fibers, carbon powder, minerals) as a filler material.

22. The method of claim 1, further comprising selecting the casting material to maximize the transmission of mechanical vibrations from the piezoelectric element into the carrier when the piezoelectric element is excited with a vibratory electric signal.

23. The method of claim 1, further comprising exerting a static preload on the piezoelectric element by electrically polarizing the piezoelectric element after the piezoelectric element is held by the hardened casting material.

24. The method of claim 1, further comprising holding the piezoelectric element in position by pins resiliently urged against the piezoelectric.

* * * * *